United States Patent
Hillman et al.

(10) Patent No.: US 12,283,499 B2
(45) Date of Patent: Apr. 22, 2025

(54) METHOD AND/OR SYSTEM FOR COATING A SUBSTRATE

(71) Applicant: Service Support Specialties, Inc., Montville, NJ (US)

(72) Inventors: Gary Hillman, Livingston, NJ (US); Rajnish Tiwari, Harrison, NJ (US); Robert D. Mohondro, Hanover, PA (US)

(73) Assignee: Service Support Specialties, Inc.

( * ) Notice: Subject to any disclaimer, the term of this patent is extended or adjusted under 35 U.S.C. 154(b) by 148 days.

(21) Appl. No.: 18/062,661

(22) Filed: Dec. 7, 2022

(65) Prior Publication Data

US 2023/0096972 A1    Mar. 30, 2023

Related U.S. Application Data

(63) Continuation of application No. 17/514,094, filed on Oct. 29, 2021, now Pat. No. 11,532,494.
(Continued)

(51) Int. Cl.
*H01L 21/67* (2006.01)
*B05D 1/00* (2006.01)
(Continued)

(52) U.S. Cl.
CPC .......... *H01L 21/6715* (2013.01); *B05D 1/005* (2013.01); *G03F 7/162* (2013.01); *H01L 21/02282* (2013.01); *H01L 21/02365* (2013.01)

(58) Field of Classification Search
CPC .......... H01L 21/6715; H01L 21/02282; B05D 1/005; G03F 7/162
See application file for complete search history.

(56) References Cited

U.S. PATENT DOCUMENTS

| 5,472,502 A | 12/1995 | Batchelder |
| 5,591,264 A | 1/1997 | Sugimoto et al. |

(Continued)

FOREIGN PATENT DOCUMENTS

| JP | 63072373 A | 4/1988 |
| JP | H4-278517 | 10/1992 |

(Continued)

OTHER PUBLICATIONS

Supplementary European Search Report EP21892576 Issued Nov. 12, 2024.

*Primary Examiner* — Nathan H Empie
(74) *Attorney, Agent, or Firm* — The Belles Group, P.C.

(57) ABSTRACT

A system and/or method for coating a substrate. The system may include a chuck for holding and rotating the substrate, a dispensing subsystem for dispensing a coating material onto the substrate, and a shield member. The shield member may be movable towards and away from the substrate during the coating procedure. The shield member may have an inverted funnel shape. The shield member may include a central chamber through which a solvent vapor flows and a peripheral chamber that is fluidly separated from the central chamber through which a gas flows. During a coating procedure, the shield member may be moved very close to the substrate and the solvent vapor and gas may flow onto the substrate to create a solvent rich ambient around the substrate and prevent aerosols of the coating material from redepositing onto the substrate after being flung off due to spinning of the substrate.

17 Claims, 19 Drawing Sheets

Related U.S. Application Data

(60) Provisional application No. 63/112,343, filed on Nov. 11, 2020.

(51) Int. Cl.
*G03F 7/16* (2006.01)
*H01L 21/02* (2006.01)

(56) References Cited

U.S. PATENT DOCUMENTS

| | | | |
|---|---|---|---|
| 5,916,368 A | * | 6/1999 | Ebert .................. G03F 7/162 269/21 |
| 5,916,631 A | | 6/1999 | Mahneke |
| 6,013,316 A | | 1/2000 | Cubit |
| 6,395,086 B1 | | 5/2002 | Neoh |
| 8,567,339 B2 | | 10/2013 | Higashijima et al. |
| 9,768,010 B2 | | 9/2017 | Norihiro et al. |
| 10,262,880 B2 | | 4/2019 | Bassett et al. |
| 2004/0016637 A1 | | 1/2004 | Yang et al. |
| 2014/0235070 A1 | | 8/2014 | Bassett et al. |
| 2014/0251539 A1 | | 9/2014 | Tsuyoshi et al. |
| 2016/0214148 A1 | | 7/2016 | Okutani |
| 2019/0088511 A1 | | 3/2019 | Tanaka |
| 2022/0148889 A1 | | 5/2022 | Hillman et al. |

FOREIGN PATENT DOCUMENTS

| | | | | |
|---|---|---|---|---|
| JP | H08222502 A | | 8/1996 | |
| JP | 2007160282 A | * | 6/2007 | .......... F16C 32/0438 |
| JP | 2011035168 A | * | 2/2011 | |
| JP | 2017204569 A | * | 11/2017 | |
| WO | WO2012/073377 A1 | | 6/2012 | |
| WO | WO2022/103601 A1 | | 5/2022 | |

* cited by examiner

METHOD AND/OR SYSTEM FOR COATING A SUBSTRATE

CROSS-REFERENCE TO RELATED APPLICATIONS

The present application is a continuation of U.S. patent application Ser. No. 17/514,094, filed Oct. 29, 2021, which claims priority to U.S. Provisional Patent Application Ser. No. 63/112,343, filed Nov. 11, 2020, the entireties of which are incorporated herein by reference.

BACKGROUND OF THE INVENTION

The process of spin coating polymers onto a substrate or wafer is widespread in the industry of microelectromechanical systems. There are two methods currently employed to achieve the coating of polymers on a substrate: a spin method and a spray method. In the spin method, substrates are treated by applying a quantity of polymer to the desired surface of the substrate while the opposite surface of the substrate is adhered by vacuum to a rotatable vacuum chuck. The wafer is spun at a relatively high speed and excess polymer is spun off the wafer leaving a relatively thin film of polymer on the top of the wafer. In some instances, there may be a need to avoid contact with the opposite side of the substrate during the spin coating process. In such situations, the substrate may be supported along its edges by a pin. However, the pin may create unwanted turbulence which can cause the aerosols of the polymer being spun off the wafer to redeposit onto the surface of the substrate that is being coated, which results in non-uniformity in the coating coverage. Thus, a need exists for a system and method to address the aforementioned deficiencies.

SUMMARY OF THE INVENTION

The present invention is directed to a system and/or method for coating a substrate. The system may include a chuck for holding and rotating the substrate, a dispensing subsystem for dispensing a coating material onto the substrate, and a shield member. The shield member may be movable in a vertical direction towards and away from the substrate during the coating procedure. The shield member may be in the shape of an inverted funnel. The shield member may include a central chamber through which a solvent vapor flows and a peripheral chamber that is fluidly separated from the central chamber through which a gas flows. During a coating procedure, the shield member may be moved very close to the substrate and the solvent vapor and the gas may flow onto the substrate to create a solvent rich ambient around the substrate and prevent aerosols of the coating material from redepositing onto the substrate after being flung off due to spinning of the substrate.

In one aspect, the invention may be a system for coating a substrate, the system comprising: a chuck for holding the substrate and rotating the substrate about a rotational axis; a dispensing subsystem for dispensing a coating material onto a first surface of the substrate; a shield member comprising a central chamber that terminates at a central opening in a bottom end of the shield member and a peripheral chamber that terminates at a peripheral opening in the bottom end of the shield member; a source of a gas fluidly coupled to the peripheral chamber of the shield member; a source of a solvent vapor fluidly coupled to the central chamber of the shield member; and wherein during a coating procedure, the shield member is positioned adjacent to the first surface of the substrate, the solvent vapor is introduced into the central chamber of the shield member to create a solvent rich ambient around the substrate, and the gas flows through the peripheral chamber of the shield member and towards a peripheral edge portion of the substrate.

In another aspect, the invention may be a system for coating a substrate, the system comprising: a chuck for holding the substrate and rotating the substrate about a rotational axis; a dispensing subsystem configured to dispense a coating material onto a first surface of the substrate; a shield member comprising an inverted funnel shaped body that defines a central chamber having a cross-sectional area that increases moving from a top end of the shield member to a bottom end of the shield member; and wherein after dispensing the coating material onto the first surface of the substrate, the shield member is positioned adjacent to the first surface of the substrate with the bottom end of the shield member spaced no more than 5 mm from the first surface of the substrate.

In yet another aspect, the invention may be a method of coating a substrate, the method comprising: supporting the substrate in a horizontal orientation; positioning a shield member at a first distance from the substrate and flowing a solvent vapor through a central chamber of the shield member to create a solvent rich ambient around the substrate; dispensing a coating material onto a first surface of the substrate; moving the shield member towards the first surface of the substrate while continuing to flow the solvent vapor through the central chamber of the shield member until the shield member is positioned a second distance from the substrate, the second distance being less than the first distance; rotating the substrate about a rotational axis to form a film of the coating material on the first surface of the substrate; and flowing a gas through a peripheral chamber of the shield member that at least partially surrounds the central chamber of the shield member, the gas that exits the peripheral chamber flowing towards the first surface of the substrate in a direction away from the rotational axis.

In a further aspect, the invention may be a method of coating a substrate, the method comprising: positioning a substrate on a chuck; dispensing a coating material onto a first surface of the substrate; positioning a shield member comprising an inverted funnel shaped body adjacent to the first surface of the substrate so that a bottom end of the shield member is no more than 5 mm away from the first surface of the substrate; and rotating the substrate about a rotational axis to form a film of the coating material on the first surface of the substrate.

In another aspect, the invention may be a chuck for holding a substrate and spinning the substrate about a rotational axis during a spin coating procedure, the chuck comprising: an annular top edge; a floor portion that is recessed relative to the annular top edge; and a plurality of support members protruding from the annular top edge, each of the support members comprising: an upstanding wall portion having a convex outer surface and a concave inner surface; and a ledge portion extending from the concave inner surface of the upstanding wall portion towards the rotational axis, the ledge portion being inclined downwardly as it extends from the upstanding wall portion In yet another aspect, the invention may be a shield member for preventing deposition of particles onto a substrate during a spin coating procedure, the shield member comprising: a top portion; an inner annular wall extending from the top portion to a distal end; an outer annular wall extending from the top portion to a distal end, the outer annular wall circumferentially surrounding the inner annular wall in spaced apart manner; a central chamber defined by an inner surface of the inner annular wall; and a peripheral chamber defined between the inner and outer annular walls, the peripheral chamber being fluidly isolated from the central chamber Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE INVENTION

Figure 1:
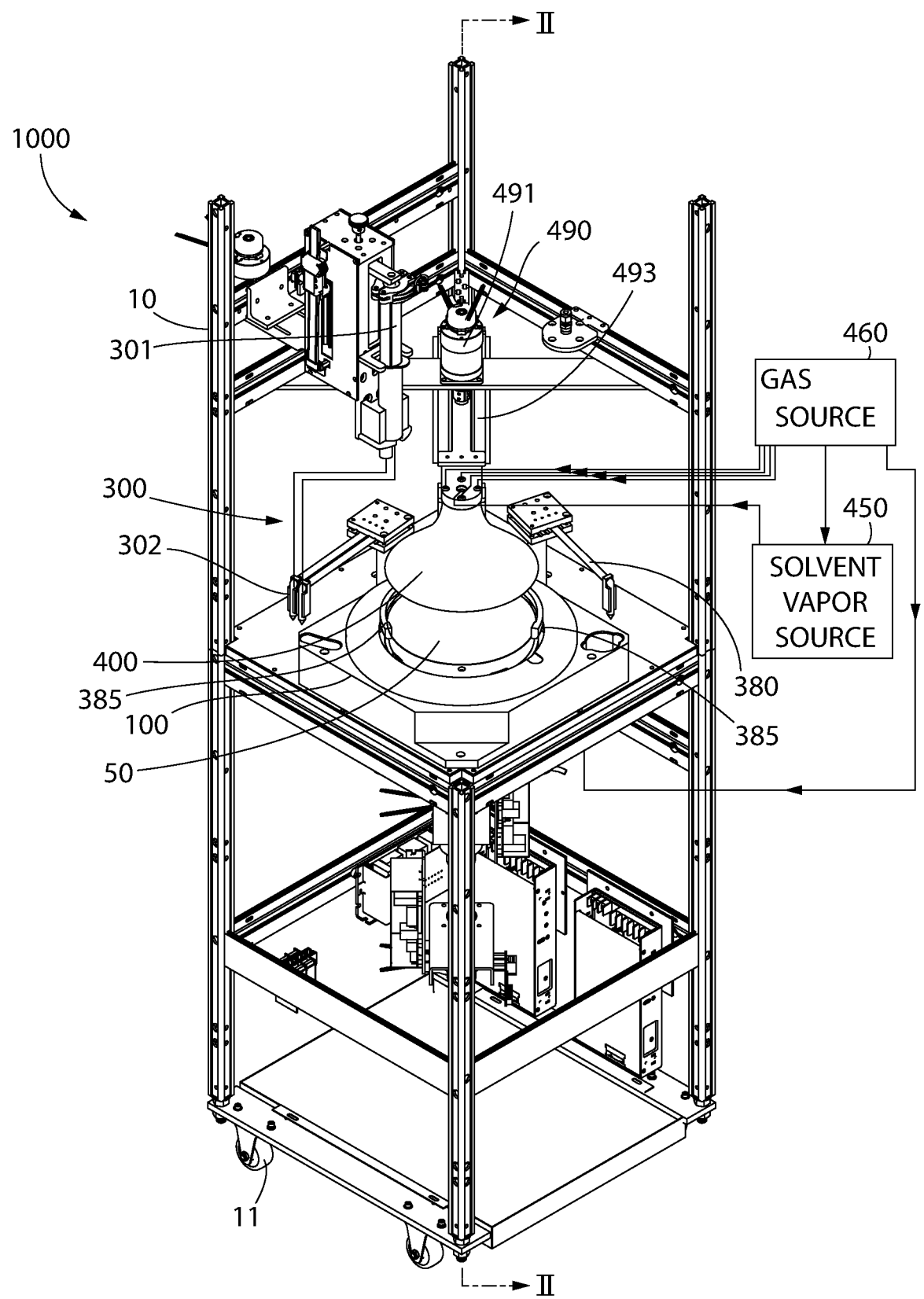
FIG. 1 is a perspective view of a substrate coating system in accordance with an embodiment of the present invention.

The following description of the preferred embodiment(s) is merely exemplary in nature and is in no way intended to limit the invention, its application, or uses.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

Referring to FIGS. 1-4 concurrently, a substrate coating system (hereinafter "the system") 1000 will be described in accordance with an embodiment of the present invention. For purposes of this invention, it is to be understood that the term substrate is intended to mean any solid substance onto which a layer of another substance is applied and that is used in, for example, the solar or semiconductor industries. This includes, without limitation, silicon wafers, glass substrates, fiber optic substrates, fused quartz, fused silica, epitaxial silicon, raw wafers, solar cells, medical devices, disks and heads, flat panel displays, microelectronic masks, and other applications that may require undergoing the processes described herein. The terms substrate and wafer may be used interchangeably throughout the description herein. Furthermore, it should be understood that the invention is not limited to any particular type of substrate and the methods described herein may be used for the processing of any flat article. Typically, the substrate is a flat article used in the fabrication of an integrated circuit, although the invention is not to be so limited in all embodiments. Such substrates may be formed from a thin slice of a semiconductor material, such as a crystalline silicon. Such substrates may require coating and the system 1000 described herein is configured to perform the coating on the substrates.

In a traditional substrate coating system, a small amount of a coating material is applied onto the center or near the center of the substrate, which is either spinning at low speed or not spinning at all. The substrate is then rotated at very fast speeds (up to 10,000 rotations per minute) to spread the coating material across the surface of the substrate by centrifugal force. As the substrate is rotated, the coating material spins off the edges of the substrate until the desired thickness of the film remains on the substrate as a coating layer. In such systems, the substrate may be supported by a chuck and held thereon by vacuum. However, in some situations it is not possible or advisable to apply vacuum suction onto the surface of the substrate that is opposite the surface being coated.

It is particularly desirable to avoid contact with the surface of the substrate that is not being coated when the surface of the substrate being coated is the back surface of the substrate. Thus, typically when the front surface (i.e., the device side) of the substrate is being coated, the back surface of the substrate is adhered to a vacuum chuck which then rotates the wafer. This is possible because there is not a great need for delicacy on the back surface of the substrate. However, when the back surface of the substrate is being coated, it is generally undesirable to contact the front surface of the substrate directly with the chuck, and particularly with vacuum suction, because such contact is likely to damage or contaminate the substrate. The techniques and processes described herein allow for coating of the back side without contacting the front side, and has the additional advantage of preventing aerosols or droplets or particles of the coating material that are flung off during the spinning of the substrate from becoming redeposited onto either surface of the substrate. Of course, the techniques and processes described herein may also be used when the front surface of the substrate is being coated and there is a desire to avoid contact with the back surface of the substrate. Thus, in the description provided herein the substrate will be described as having a first surface and a second surface opposite the first surface, with the first surface being coated. The first surface is preferably the back side of the wafer or substrate, but the invention should not be limited to this and the first surface may be the front side of the wafer or substrate in other embodiments.

The substrate coating system 1000 comprises a frame 10 that supports the remaining components of the system 1000. The frame 10 is supported by wheels 11 in the exemplified embodiment, although the wheels 11 are not required. Moreover, the frame 10 itself is not required in all embodiments, as the components of the system 1000 could be positioned on a countertop or the like in other embodiments.

The system 1000 generally comprises a process bowl 100 which defines a cavity 101 having an open top end 102, a chuck 200 that is positioned within the process bowl 100 and which is configured to hold and spin the substrate 50 within the process bowl 100, a dispensing subsystem 300 that is configured to dispense a coating material onto the substrate 50, and a shield member 400 that is configured to shield the substrate to prevent aerosols or droplets/particles of the coating material that has spun off the substrate from being redeposited thereon. These components and others will be described in greater detail below.

Figure 2:
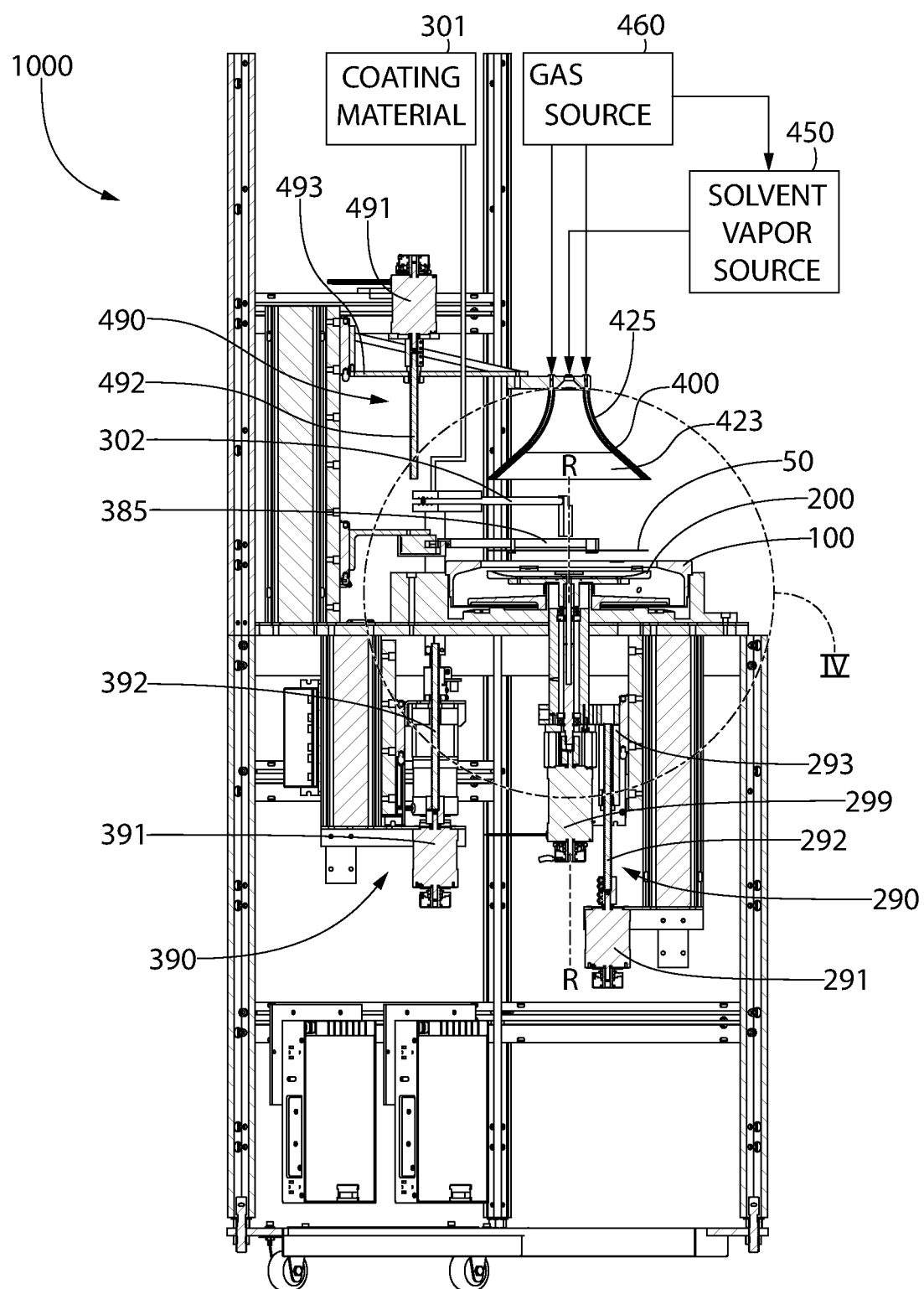
FIG. 2 is a cross-sectional view taken along line II-II of FIG. 1.

The system 1000 comprises a first actuator unit 490 that is operably coupled to the shield member 400 to control movement of the shield member 400 relative to the chuck 200. The system 1000 also comprises a control unit or a controller 900 (see FIG. 3) that is operably coupled to the first actuator unit 490. In the exemplified embodiment, the controller 900 controls activation of the first actuator unit 490. However, in other embodiments activation of the first actuator unit 490 may be achieved manually or using other means. The first actuator unit 490 is configured to move the shield member 400 upwardly and downwardly in a vertical direction either towards or away from the chuck 200 and/or substrate 50 at various times during the coating process. In FIGS. 1, 2, and 4, the shield member 400 is illustrated in a first position, or an up position such that it is spaced away from the chuck 200 and the substrate 50. From this position, the shield member 400 may be moved downwardly into a down position (see FIGS. 14A and 14B) whereby the shield member 400 is positioned extremely close (i.e., 3 mm or less, or more specifically 1.5 mm or less, or more specifically about 1 mm) to the substrate 50 which is supported on the chuck 200. These features will be described in much greater detail below.

In the exemplified embodiment, the first actuator unit 490 comprises a first motor 491, a first threaded member 492 that is operably coupled to the first motor 491, and a plate member 493 that interacts with the first threaded member 492. The plate member 493 is coupled to the shield member 400 so that as the plate member 493 moves upwardly and downwardly along the first threaded member 492, the shield member 400 also moves upwardly and downwardly. When the first actuator unit 490 is activated (either manually or automatically by the controller 900), the first motor 491 is activated which causes the first threaded member 492 to rotate about its longitudinal axis. As the first threaded member 492 rotates, the plate member 493 moves upwardly or downwardly due to interaction between interior threads of the plate member 493 and the threads of the first threaded member 492. The direction of rotation of the first threaded member 392 (clockwise or counterclockwise) will dictate whether the shield member 400 moves upwardly or downwardly.

The first actuator unit 490 described herein and shown in the drawings is merely exemplary and is not intended to be limiting of the invention in all embodiments. That is, other components could form the first actuator unit 490 in other embodiments, such as belts, pulleys, tracks, rails, followers, pins, springs, or the like. The general concept is that the first actuator unit 490 comprises the components necessary to move the shield member 400 upwardly and downwardly relative to the chuck 200 and substrate 50 during the coating process.

Figure 5:
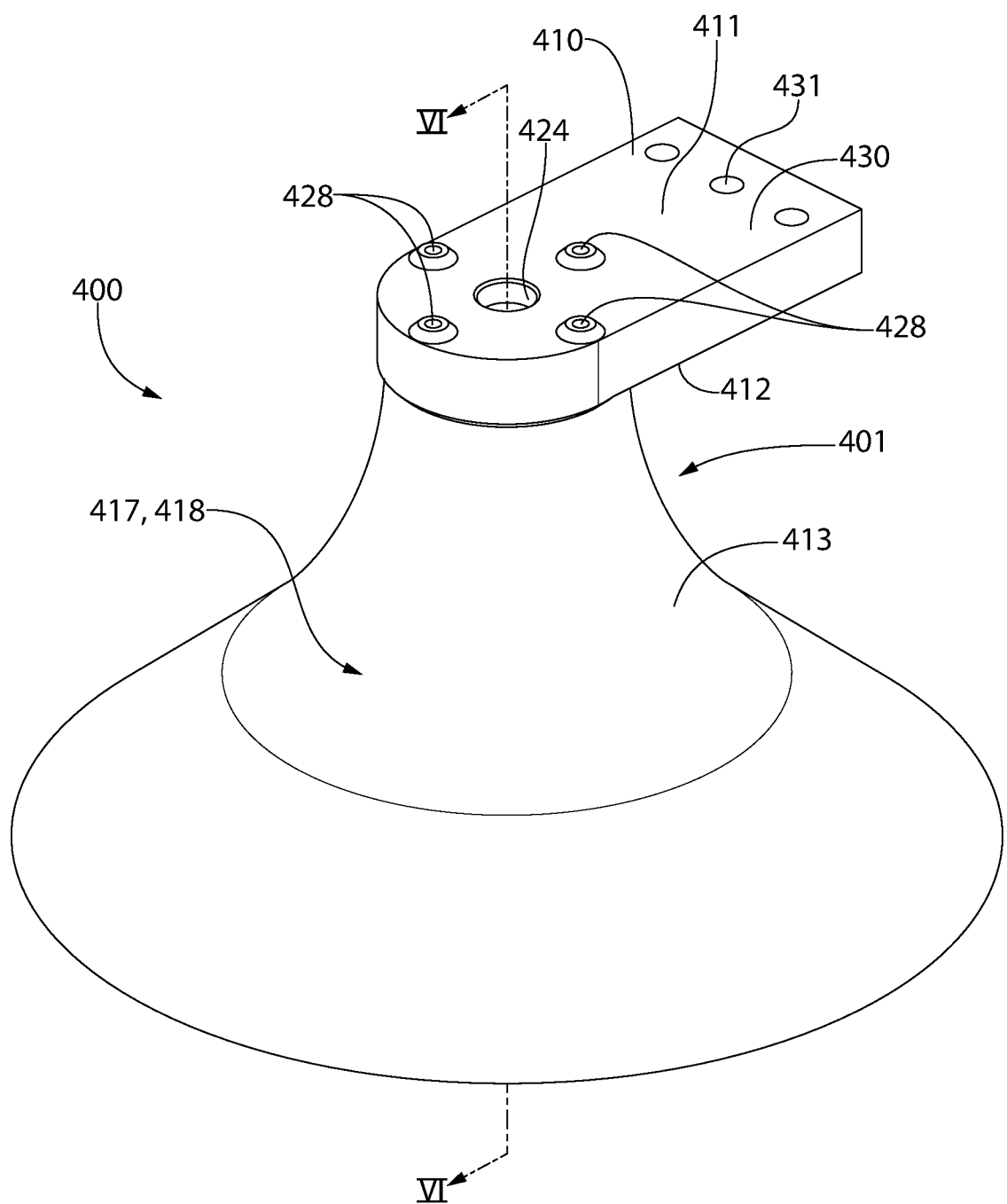
FIG. 5 is a perspective view of a shield member of the substrate coating system of FIG. 1.
Figure 6:
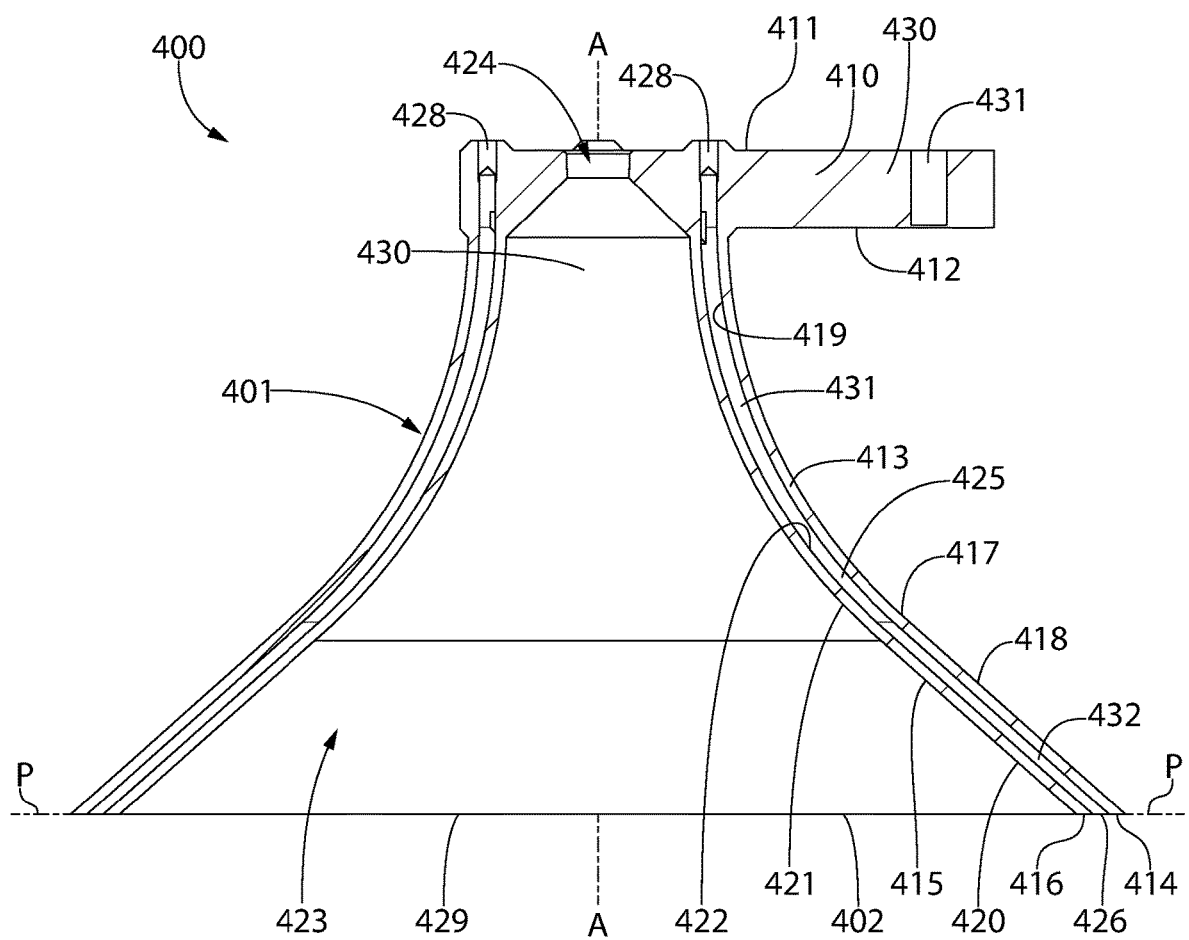
FIG. 6 is a cross-sectional view taken along line VI-VI of FIG. 5.

Referring to FIGS. 5 and 6, the structure of the shield member 400 will be described. The shield member 400 is generally in the form of an inverted funnel shaped body 401. That is, while a funnel is generally wider at the top and narrower at the bottom, the opposite is true of the shield member 400 of the exemplified embodiment. Of course, the shield member 400 may take on other shapes in other embodiments, including being a cylindrical body, a cone-shaped body, or the like. The shield member 400 comprises a longitudinal axis A-A, a top portion 410 having a top end 411 and a bottom end 412 opposite the top end 411, an outer wall 413 extending from the bottom end 412 of the top portion 410 to a distal edge 414, and an inner wall 414 extending from the bottom end 412 of the top portion 410 to a distal edge 416. The distal edges 414, 416 of the outer and inner walls 413, 415 are aligned along a horizontal plane P-P such that the distal edges 414, 416 of the outer and inner walls 413, 415 collectively form a bottom end 402 of the shield member 400.

The outer wall 413 comprises an outer surface 417 that forms an outer surface 418 of the shield member 400 and an inner surface 419 opposite the outer surface 417. The inner wall 415 comprises an inner surface 420 that forms an inner surface 421 of the shield member 400 and an outer surface 422 opposite the inner surface 420. The outer surface 417 of the outer wall 413 (and hence also the outer surface 418 of the shield member 400) is concave and the inner surface 420 of the inner wall 415 (and hence also the inner surface 421 of the shield member 400) is convex, thereby providing the shield member 400 with the inverted funnel shape. The outer surface 422 of the inner wall 415 is also concave, and the inner surface 419 of the outer wall 413 is also convex. In the exemplified embodiment, the outer and inner walls 413, 415 have the same curvature along their entire length, although the outer wall 413 has a greater diameter than the inner wall 415 so that the outer wall 413 circumferentially surrounds the inner wall 415 in a spaced apart manner.

The shield member 400 comprises a central chamber 423 that is bounded by the inner surface 420 of the inner wall 415 (which is also the inner surface 421 of the shield member 400). Furthermore, a central inlet 424 extends through the top portion 410 of the shield member 400 from the bottom end 412 thereof to the top end 411 thereof. The central inlet 424 forms a passageway from an area external to the top portion 410 of the shield member 400 into the central chamber 423. This allows for a fluid coupling between the central inlet 424 and a fluid source for purposes of introducing the fluid (i.e., gas or vapor) into the central chamber, as discussed below. The central chamber 423 terminates in a central outlet 429 at the bottom end 402 of the shield member 400. The central chamber 423 has a cross-sectional area that increases moving in a direction from a top end 430 of the central chamber 423 that is adjacent to the top portion 410 of the shield member 400 to the bottom end 402 of the shield member 400. More specifically, owing to the convex shape of the inner surface 421 of the shield member 400, the cross-sectional area of the central chamber 423 continuously decreases moving from the top end of the central chamber 423 to the bottom end 402 of the shield member 400.

The shield member 400 also comprises a peripheral chamber 425 that is defined between the inner surface 419 of the outer wall 413 and the outer surface 422 of the inner wall 415. In the exemplified embodiment, the peripheral chamber 425 is a singular chamber that circumferentially surrounds the central chamber 423. However, the invention is not to be so limited in all embodiments and the peripheral chamber 425 may comprise a plurality of chamber sections that are separated by a divider wall. In the exemplified embodiment, the peripheral chamber 425 has a constant cross-sectional area along its entire length. That said, in other embodiments it may be possible to form the peripheral chamber 425 with a non-constant cross-sectional area in other embodiments. The peripheral chamber 425 is an annular chamber in the exemplified embodiment, and it terminates in an annular opening or outlet 426 in the bottom end 402 of the shield member 400. While the annular opening 426 is preferably continuous all the way around, it may be formed in discontinuous sections in other embodiments. The annular opening 426 may circumferentially surround the central outlet 429.

In the exemplified embodiment, the peripheral chamber 425 is fluidly isolated from the central chamber 423 along an entire length of the shield member 400. That is, the inner wall 415 forms a barrier between the peripheral chamber 425 and the central chamber 423 for the entirety of those chambers. The shield member 400 is preferably formed from a non-porous material, such as plastic, metal, or the like, which prevents the fluids from passing through the inner wall 415 of the shield member 400 to move between the central and peripheral chambers 423, 425. Thus, any fluid (such as a gas or a vapor) that is present in the central chamber 423 will not mix with any fluid (such as a gas or a vapor) that is present in the peripheral chamber 425 at least until those fluids exit the shield member 400 at the bottom end 402 of the shield member 400. In the exemplified embodiment, the fluids in the peripheral and central chambers 423, 425 are prevented from mixing within the shield member 400.

In the exemplified embodiment, both of the outer and inner walls 413, 415 have a contoured proximal portion adjacent to the top portion 410 and a linear distal portion adjacent to the bottom end 402. Thus, the peripheral chamber 425 defined between the outer and inner walls 413 also has an arcuate or curved proximal portion 431 adjacent to the top portion 410 of the shield member 400 and a linear portion 432 that extends from the curved proximal portion 431 to the bottom end 402 of the shield member 400. As a result, the air or gas stream exiting the peripheral chamber 425 through the annular opening 426 is a linear air or gas stream. The gas or air exiting through the annular opening 426 will flow in an outward direction away from the longitudinal axis A-A of the shield member 400. As will be discussed below, this ensures that the air or gas stream exiting the peripheral chamber 425 through the annular outlet 426 will blow the air towards the peripheral edges of the substrate in a direction away from a center of the substrate, to prevent aerosols, droplets, or particles from redepositing onto the substrate. In alternative embodiments, the peripheral chamber 425 could maintain a curvature along its entire length.

The shield member 400 comprises a plurality of peripheral inlets 428 in the top portion 410 that extend through the top portion 410 from the top end 411 to the bottom end 412. Each of the plurality of peripheral inlets 428 forms a passageway from the exterior of the shield member 400 into the peripheral passageway 425. While in the exemplified embodiment there are a plurality of the peripheral inlets 428, in other embodiments there may be a singular annular peripheral inlet 428 that extends continuously in a ring-like shape. In other embodiments, there may be just a single one of the peripheral inlets 428 without being annular, and in other embodiments there may be more peripheral inlets 428 than that which is shown in the illustrative embodiment. The peripheral inlets 428 are aligned along a reference ring that surrounds the central inlet 424.

The top portion 410 of the shield member 400 also comprises a cantilevered portion 430 that extends over a portion of the funnel shaped body 401. The cantilevered portion 430 comprises a plurality of apertures 431, which are configured to receive a fastener such as a screw, a bolt, or the like, for purposes of coupling the shield member 400 to the plate member 493 of the first actuator unit 490 described above. This ensures that as the plate member 493 moves upwardly and downwardly along the first threaded member 492, the shield member 400 also moves upwardly and downwardly.

Referring to FIGS. 1-3, as discussed above the shield member 400 is fluidly coupled to several gas/vapor sources so that gas/vapor can be introduced into the central chamber 423 and the peripheral chamber 425. The system 1000 comprises a solvent vapor source 450 that is operably coupled to the central inlet 424 of the shield member 400 so that the solvent vapor can be introduced into the central chamber 423 of the shield member 400. The solvent vapor source 450 may be a tank that is partially filled with a solvent. Furthermore, a gas is introduced into the tank from a gas source 460. The gas may be an inert gas in some embodiments, but the invention is not to be so limited in all embodiments. In the exemplified embodiment, the gas source 460 contains nitrogen, although the invention should not be so limited in all embodiments and other gases may be used in other embodiments. For example, in one alternative embodiment the gas source 460 may contain clean dry air. The gas (e.g., nitrogen) passes through the solvent in the tank and forms bubbles therein. As the bubbles are formed in the solvent and pass through to the airspace, the bubbles become saturated with solvent vapor, which can then flow to the central inlet 424 of the shield member 400 and into the central chamber 423 of the shield member 400. The solvent vapor source 450 may also be referred to herein and known in the industry as a bubbler. Additional details about such a solvent vapor source/bubbler may be found in U.S. Pat. No. 5,472,502, the entirety of which is incorporated herein by reference.

As mentioned above, the system 1000 also comprises the gas source 460. The gas source 460 is fluidly coupled to the solvent vapor source 450 so that the gas can flow from the gas source 460 into the solvent vapor source 450 to generate the solvent vapor which is later introduced into the central chamber 423 of the shield member 400, as discussed above. The gas source 460 is also fluidly coupled to each of the peripheral inlets 428 of the shield member 400 to introduce the gas into and through the peripheral chamber 425. Thus, during operation the solvent vapor flows into and through the central chamber 423 to create a solvent rich ambient around the substrate 50 and the gas (e.g., nitrogen gas) flows into and through the peripheral chamber 425 and then towards the edges of the substrate 50 to prevent aerosols or particles from the flung off coating material from becoming redeposited onto the substrate 50. In one embodiment, the solvent vapor may be cyclopentanone solvent gas, although other types of solvent gas or solvent vapor may be used in other embodiments with similar results.

Figure 3:
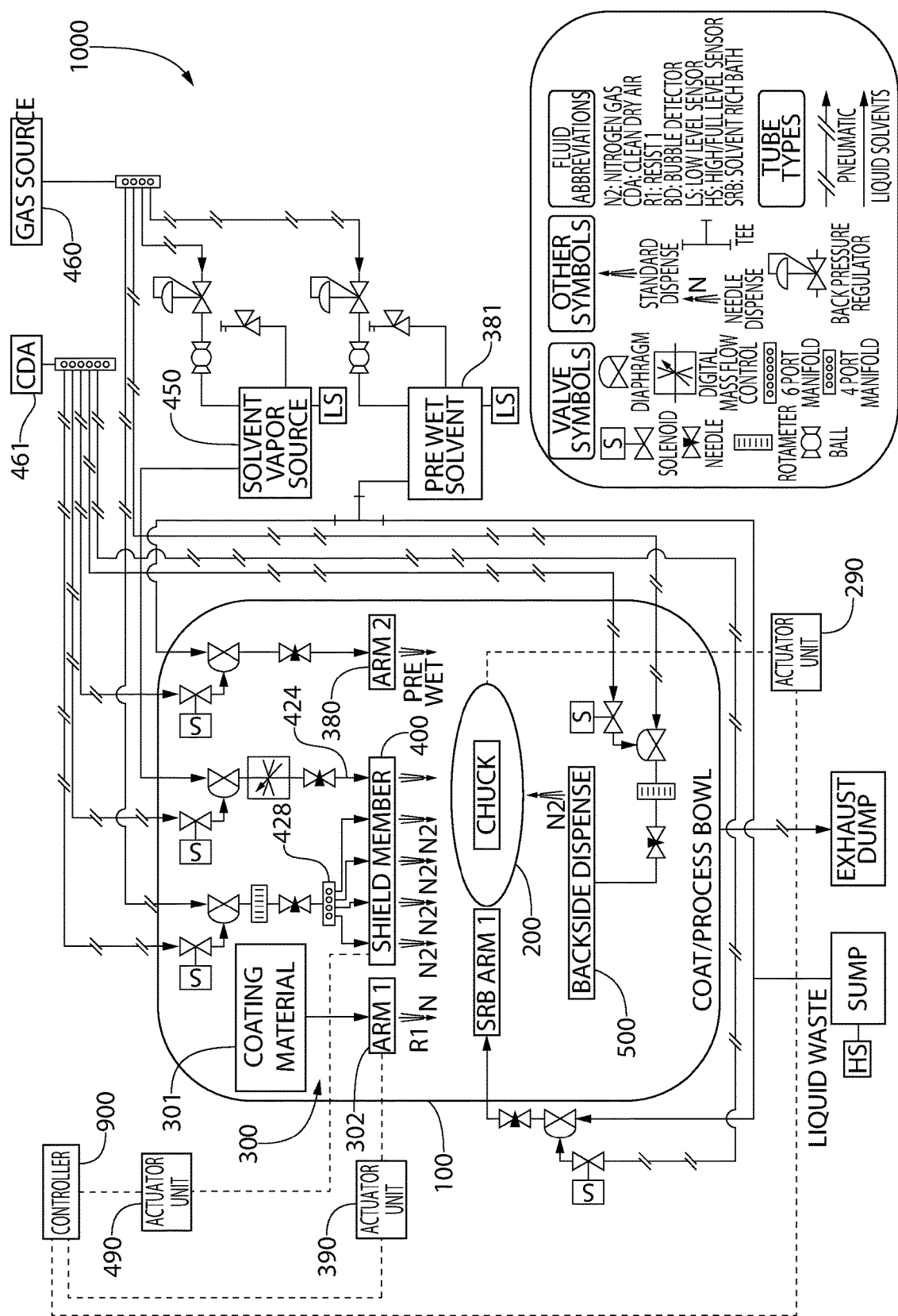
FIG. 3 is a schematic diagram of the substrate coating system of FIG. 1.
Figure 4:
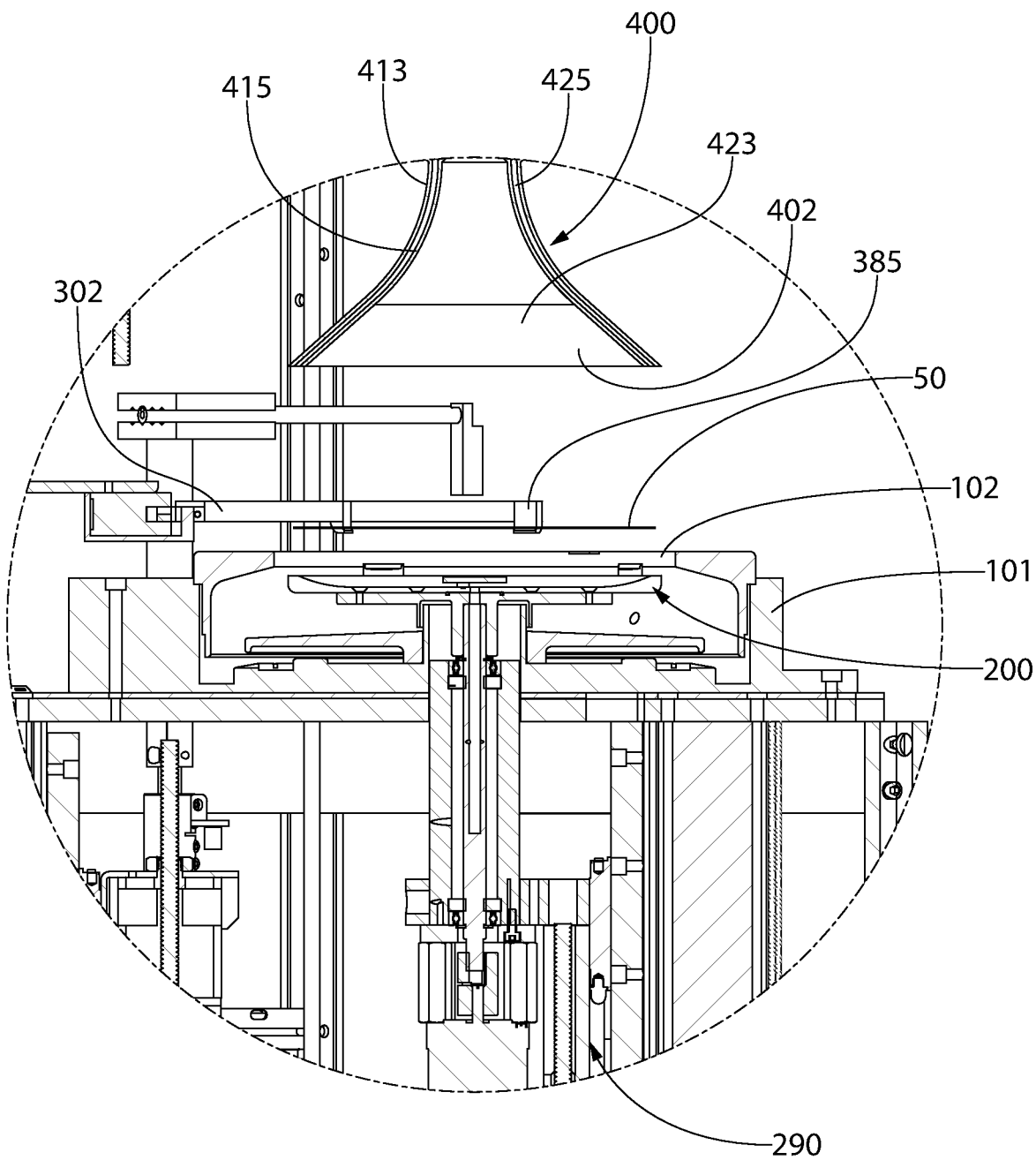
FIG. 4 is a close-up view of area IV of FIG. 3.

As seen in FIG. 3, there are various valves positioned along the conduits that extend between the gas source 460 and the peripheral inlets 428 and along the conduit that extends between the solvent vapor source 450 and the central inlet 424. Those valves may be solenoid valves in some embodiments. Although not illustrated in FIG. 3, the controller 900 may be operably coupled to each of the valves in order to control the opening and closing of those valves. The coupling between the controller 900 and the valves is not shown in FIG. 3 in order to avoid clutter, as the description of this operable coupling should serve as a sufficiently enabling description without explicitly showing it in the figures with dashed lines.

Figure 12A:
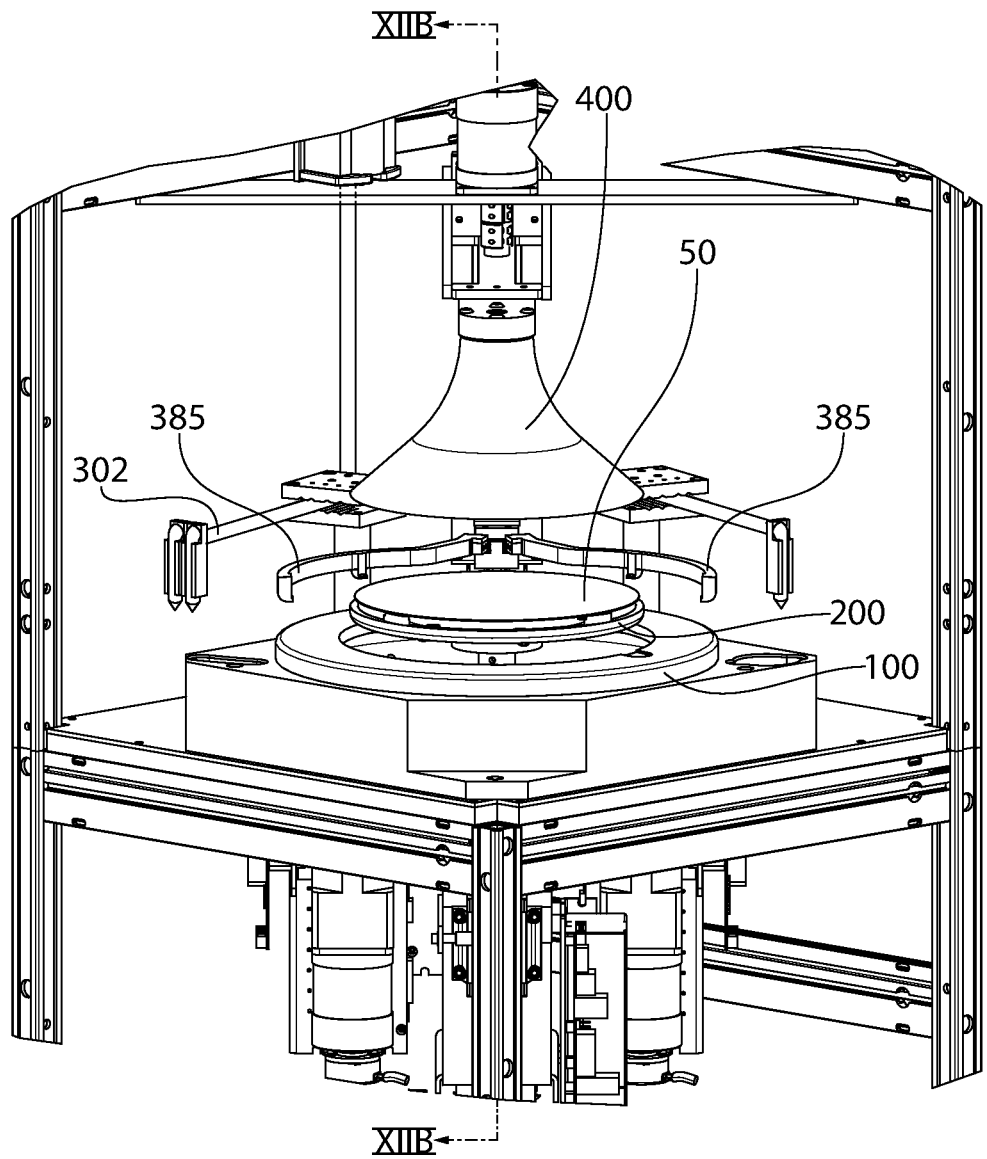
FIG. 12A is a partial top perspective view of the substrate coating system of FIG. 1 with the shield member in the up position and the substrate being supported by the chuck which is also in an up position.
Figure 12B:
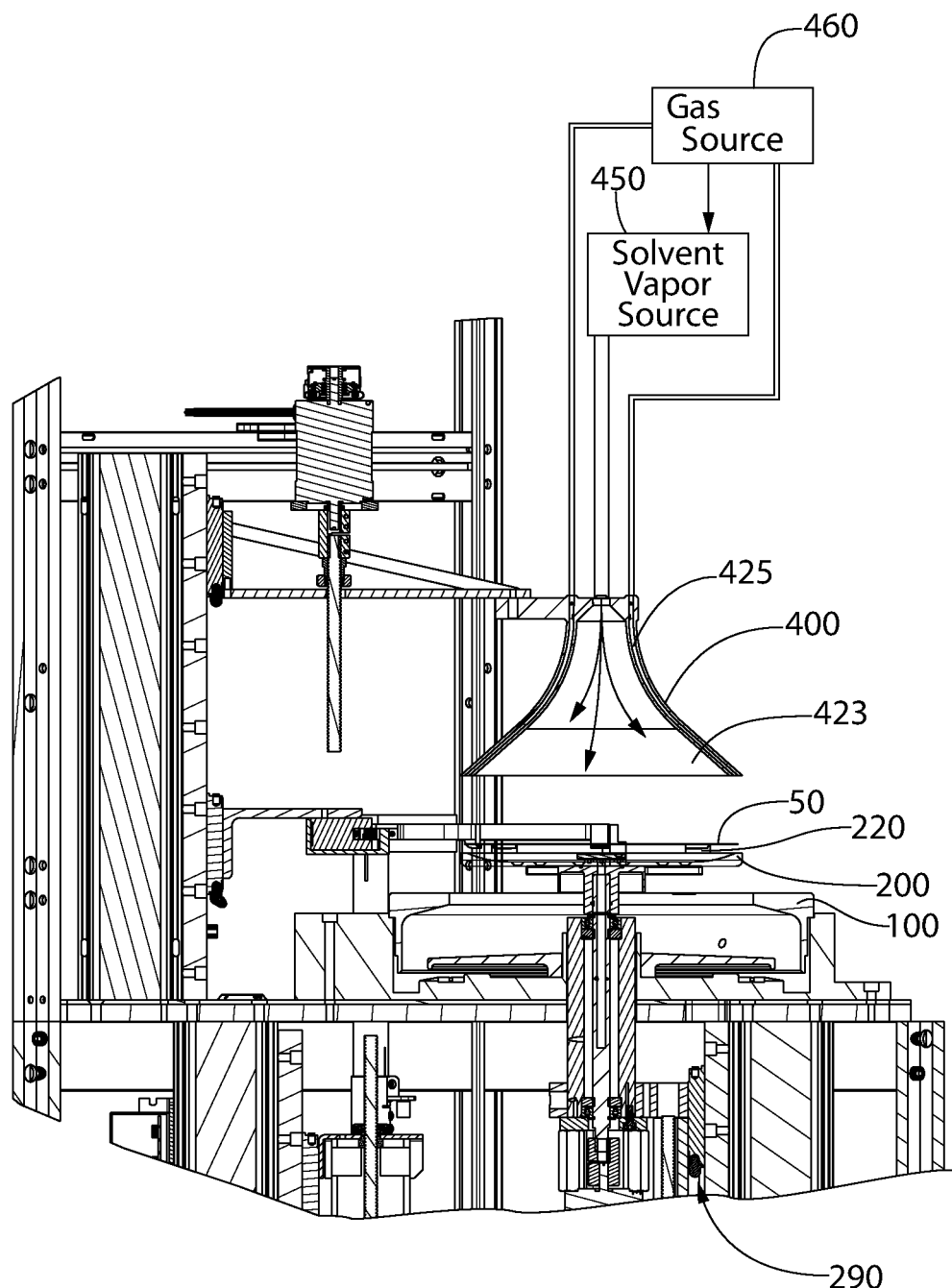
FIG. 12B is a cross-sectional view taken along line XIIB-XIIB of FIG. 12A, with a solvent vapor source and a nitrogen source and their fluid couplings illustrated schematically.

Still referring to FIGS. 1-3, the system 1000 comprises a second actuator unit 290 that is operably coupled to the chuck 200 for purposes of controlling movement of the chuck 200. The second actuator unit 290 may also be operably coupled to the controller 900 so that the activation of the second actuator unit 290 may be controlled automatically by the controller 900 and any algorithms stored therein. The second actuator unit 290 generally comprises a motor 291, a second threaded member 292, and an internally threaded sleeve member 293 positioned around the second threaded member 292. Thus, as the motor 291 is activated and rotating, the second threaded member 292 is also activated and rotating, causing the internally threaded sleeve member 293 to move upwardly and downwardly along the second threaded member 292. The internally threaded sleeve member 293 is further attached to the chuck 200 so that as the internally threaded sleeve member 293 moves upwardly and downwardly along the second threaded member 292, the chuck 200 also moves upwardly and downwardly. The chuck 200 is illustrated in its up or extended position in FIGS. 12A and 12B and the chuck 200 is illustrated in its down or retracted position in FIGS. 13A and 13B.

The system 1000 also comprises a motor 299 that is operably coupled to the chuck 200 for purposes of rotating the chuck about a rotational axis R-R. The motor 299 may be operably coupled to the controller 900 so that the controller 900 can control activation/deactivation of the motor 299 in accordance with pre-stored algorithms related to the processing and operation of the system 1000. In other embodiments, the motor 299 may be manually activated by a user. The motor 299 is generally activated to spin the chuck 200 while the chuck 200 is holding/supporting the substrate 50 to spread out the coating material previously deposited onto the substrate 50 and form a thin film of the coating material on the substrate 50.

The controller 900 may in some embodiments comprise a processor and a memory device. The processor and memory device may be separate components, or the memory device may be integrated with the processor within the controller 900. Furthermore, the controller 900 may include only one processor and one memory device, or it may include multiple processors and multiple memory devices. The processor of the controller 900 may be any computer or central processing unit (CPU), microprocessor, micro-controller, computational device, or circuit configured for executing some or all of the processes described herein, including without limitation: (1) opening and closing of the valves of the system 1000; (2) activating and deactivating the first, second, and third actuator units 490, 390, 290; and (3) activating and deactivating the motor 299 which rotates the chuck 200. The controller 900 may also control operation of any pumps or other electronic devices present in the system 1000. As shown in FIG. 3, the system may include a rotameter, a mass flow controller, and other electronic components and sensors which may be operably coupled to the controller 900 to facilitate the operation of the controller 900 and its activation/deactivation of the other components of the system 1000.

The memory device of the controller 900 may include, without limitation, any suitable volatile or non-volatile memory including random access memory (RAM) and various types thereof, read-only memory (ROM) and various types thereof, USB flash memory, and magnetic or optical data storage devices (e.g. internal/external hard disks, floppy discs, magnetic tape CD-ROM, DVD-ROM, optical disk, ZIP™ drive, Blu-ray disk, and others), which may be written to and/or read by the processor which is operably connected thereto. The memory device may store algorithms and/or calculations that can be used (by the processor) to determine when to activate/deactivate the various actuator units 290, 390, 490 and the motor 299 and when to open/close the various valves and/or operate any pumps of the system 1000.

As noted above, the system 1000 also comprises the dispensing subsystem 300 which is configured to dispense the coating material onto the substrate 50. The dispensing subsystem 300 comprises a source of a coating material 301 and at least one dispensing arm 302 that is fluidly coupled to the coating material 301. The coating material 301 may be a polymer or a photoresist that is commonly used for coating a wafer during a spin coating procedure. The source of the coating material 301 comprises a syringe-style dispensing mechanism in the exemplified embodiment. That is, the coating material is contained in a syringe and a plunger of the syringe moves within a sleeve of the syringe to dispense the coating material from the source 301 to the dispensing arm 302. In other embodiments, the coating material may be dispensed from the source of the coating material 301 to the dispensing arm 302 via valves, pumps, or the like that are either manually controlled or automatically controlled due to operable coupling to the controller 900. That is, the source of the coating material 301 need not be a syringe in all embodiments, and can take any of a variety of different structural and functional forms as would be well understood by persons of ordinary skill in the art. The at least one dispensing arm 302 may comprise a nozzle or other fluid delivery apparatus for purposes of performing the dispensing onto the substrate. The at least one dispensing arm 302 is fluidly coupled to the source of the coating material 301 via a tube or conduit. Thus, as the coating material is dispensed from the source 301, the coating material is dispensed out of the dispensing arm 302 onto the substrate 50. The controller 900 may be operably coupled to the dispensing subsystem 300 to control the dispensing of the coating material onto the substrate during the coating operation.

The system 1000 may comprise a third actuator unit 390 that is operably coupled to the dispensing arm 302. The third actuator unit 390 may be configured to rotate the dispensing arm 302 between a first position (FIG. 1) whereby the dispensing arm 302 does not overlie the substrate 50 or the chuck 200 and a second position (FIGS. 12A and 12B) whereby the dispensing arm 302 overlies the substrate 50 and the chuck 200 for purposes of dispensing the coating material onto the substrate 50. The third actuator unit 390 may comprise a motor 391 and a threaded member 392 that cooperate with other structural components that are coupled to the dispensing arm 302 to achieve the pivoting/rotational movement of the dispensing arm 302 between the first and second positions. The third actuator unit 390 may be operably coupled to the controller 900 so that movement of the dispensing arm 302 may be achieved automatically based on algorithms stored in the controller 900.

The system 1000 may comprise a pre wet dispenser arm 380 that is fluidly coupled to a source of a pre wet solvent 381. The pre wet dispenser arm 380 may therefore dispense a pre wetting solvent onto the substrate 50 prior to coating the substrate 50 with the coating material as described herein.

The system 1000 also comprises a pair of gripper arms 385 that are positioned above the process bowl 100 for supporting and holding the substrate 50 prior to the substrate 50 being held and supported by the chuck 200. The gripper arms 385 may be configured to pivot inwardly and outwardly relative to one another to receive the substrate 50 from a robot or from a user and then release the substrate 50 onto the chuck 200. In FIGS. 1, 2, and 4, the gripper arms 385 are holding the substrate 50 prior to the substrate 50 being moved to the chuck 200. The gripper arms 385 are configured to only contact the peripheral edges of the substrate 50 without making any contact with the first and/or second surfaces of the substrate 50 to prevent any damage or contamination to those surfaces. As will be discussed below, during operation the chuck 200 is altered into its upward position so that the substrate 50 is resting on the chuck 200, and then the gripper arms 385 are pivoted outwardly to release the substrate 50 onto the chuck 200. The chuck 200 may then move back into its downward position within the process bowl 100 while supporting the substrate 50 to prepare the substrate 50 for the coating operation and the gripper arms 385 will remain in their outward position so as not to block the shield member 400 from being able to move downwardly as discussed herein.

FIG. 3 illustrates a complete schematic diagram of the system 1000. As mentioned above, in some embodiments the controller 900 may be operably coupled to each valve in the system 1000 so that the controller 900 may control the opening and closing of the valves automatically for purposes of controlling the dispensing of the gas, the solvent vapor, and the like. As seen in FIG. 3, the system 1000 comprises the gas source 460 and a clean dry air source 461. The gas from the gas source 460 and the clean dry air from the clean dry air source 461 are combined/mixed together prior to entry into the peripheral inlets 428 of the shield member 400. The solvent vapor from the solvent vapor source 450 and the clean dry air from the clean dry air source 461 are combined/mixed together prior to entry into the central inlet 424 of the shield member 400. In addition, the gas and the clean dry air may be dispensed from a backside dispenser unit 500 through the chuck 200 for dispensing onto or adjacent to the side of the substrate 50 which is opposite the side that is being coated. Some details about the air management of the chuck 200 will be described below with reference to FIGS. 8 and 9.

Figure 7:
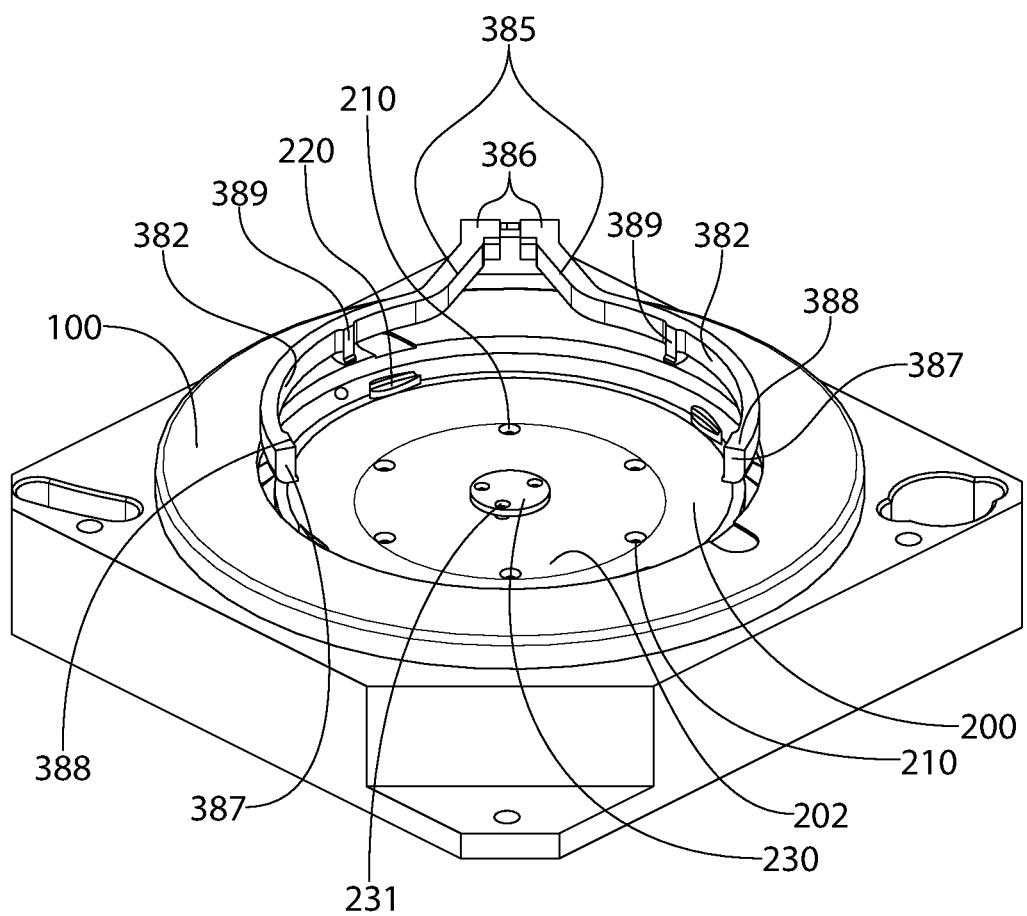
FIG. 7 is a perspective view of a process bowl and chuck of the substrate coating system of FIG. 1.

Referring to FIG. 7, the process bowl 100 is illustrated with the chuck 200 therein in a down position and with the gripper arms 385 positioned just above the process bowl 100. In FIG. 7, the gripper arms 385 are depicted in their inward position, which is the position they are in when they are holding a substrate. In the inward position, the gripper arms 385 are aligned with the chuck 200 to facilitate an easy and smooth transfer of the substrate from the gripper arms 385 to the chuck 200. One or both of the gripper arms 385 is configured to pivot outwardly to release the substrate from its grip when the chuck 200 is in position to take over responsibility for holding and supporting the substrate. The gripper arms 385 may be operably coupled to an actuator unit, which is in turn operably coupled to the controller 900, to facilitate the altering of the gripper arms 385 from their inward position as shown in FIG. 7 to their outward position as shown, for example, in FIG. 12A.

Each of the gripper arms 385 comprises an arcuate inner surface 382. The arcuate inner surface 382 of the first gripper arm 385 faces the arcuate inner surface 382 of the second gripper arm 385. The inner surfaces 382 of the gripper arms 385 are concave. This allows the shape of the inner surfaces 382 of the gripper arms 385 to somewhat correlate with the shape (i.e., round) of the substrate. The gripper arms 385 each comprises a proximal end 386 and a distal end 387. Furthermore, at the distal ends 387, the gripper arms 385 comprise grip extensions 388 that protrude inwardly from the inner surfaces 382 of the gripper arms 385. Alternatively, the grip extensions 388 may be formed by widening the gripper arms 385 along the distal portions thereof. The gripper arms 389 may have second grip extensions 389 positioned closer to the proximal end 386 thereof. Each of the grip extensions 388, 389 may comprise an angled sidewall portion and an angled ledge portion so that when the gripper arms 385 are supporting the substrate, only the lowermost edge of the substrate where the peripheral edge meets the lower surface is in contact with the gripper arms 385. In other embodiments, the entire inner surface of the gripper arms 385 may comprise the angled sidewall portion and the angled ledge portion, rather than those features being incorporated into the discrete grip extensions 388, 389. When the substrate is held by the gripper arms 385, no part of the gripper arms 385 contacts either of the front or rear surfaces of the substrate. This ensures that the contact between the gripper arms 385 and the substrate will not contaminate or damage the substrate.

Figure 8:
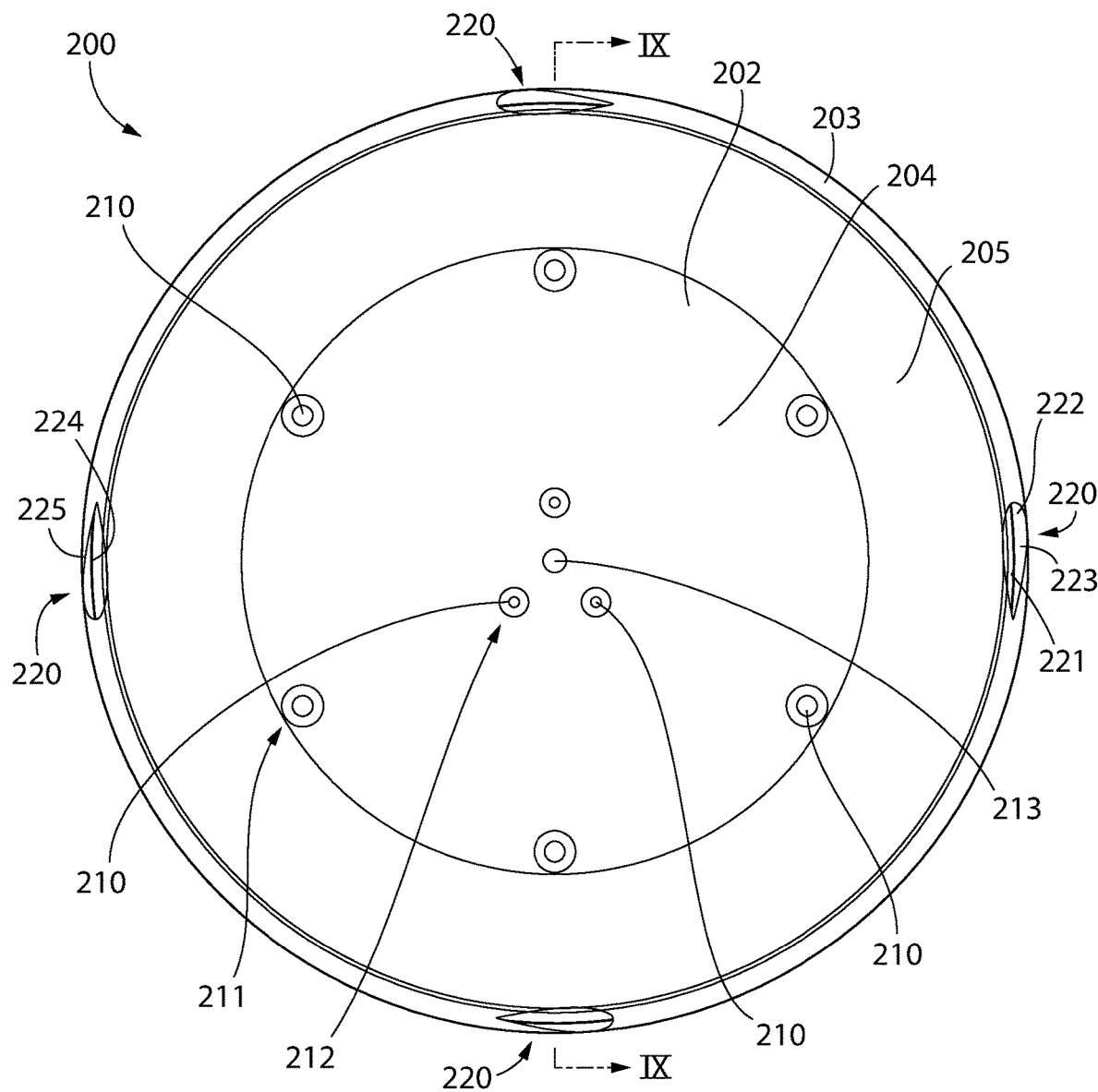
FIG. 8 is a top view of the chuck of the substrate coating system of FIG. 1.
Figure 9:
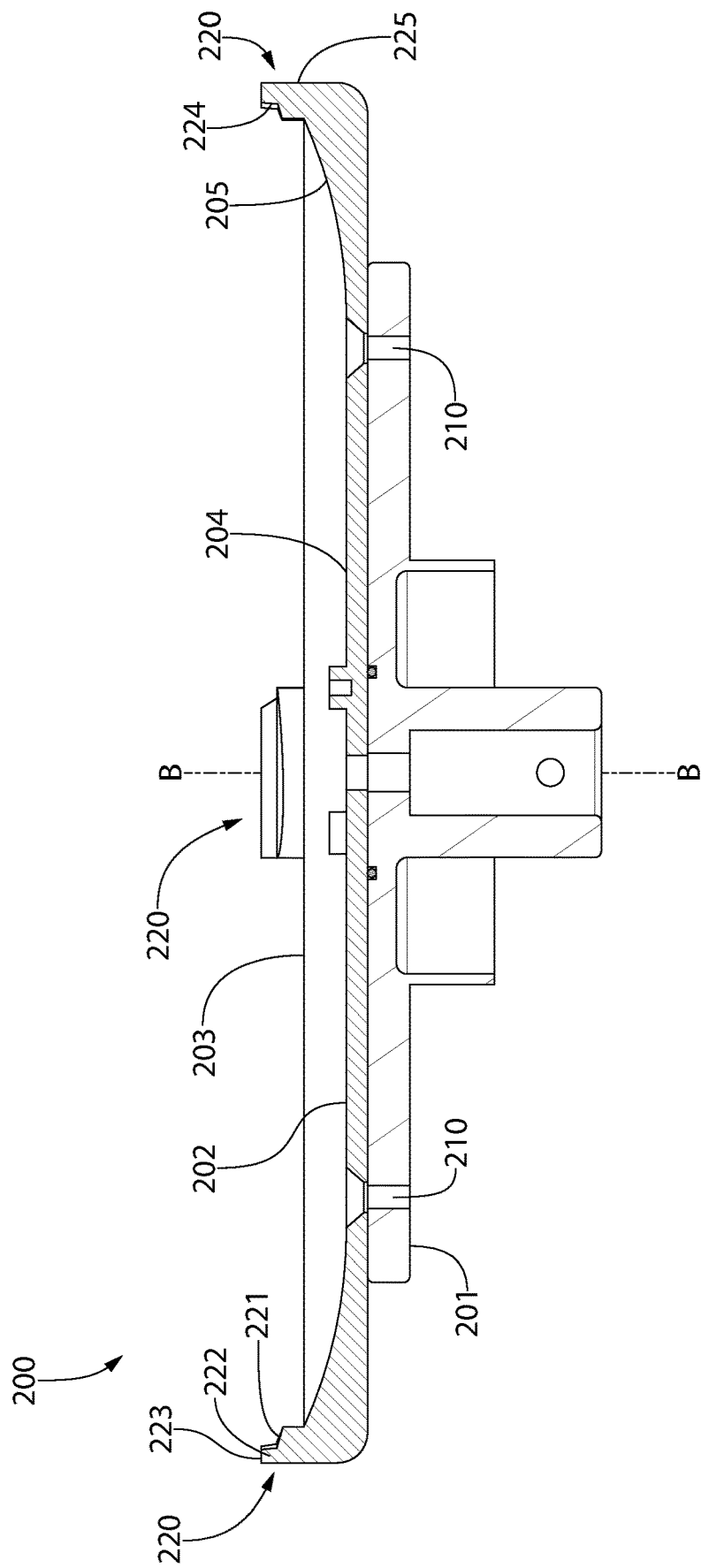
FIG. 9 is a cross-sectional view taken along line IX-IX of FIG. 8.

Referring now to FIGS. 7-9 concurrently, the chuck 200 will be described in greater detail. The chuck 200 comprises a lower surface 201, and a floor 202 and an annular top edge 203 which collectively form an upper surface that is opposite the lower surface 201. The floor 202 is recessed relative to the annular top edge 203. In particular, the floor 203 has a planar central portion 204 and a contoured peripheral portion 205 that extends from the planar central portion 204 to the annular top edge 203. As noted below, the substrate is held by the chuck 200 in an elevated position relative to the floor 202, such that the floor 202 is spaced from and does not contact any part of the substrate.

The chuck 200 comprises a plurality of ports 210 that extend from the lower surface 201 to the floor 202 for purposes of introducing a fluid, such as an gas (e.g., nitrogen gas) into the space between the substrate and the floor 202 when the substrate is being supported by the chuck 200. The ports 210 comprises an outer ring of ports 211 that comprises a plurality of ports arranged in a circumferentially spaced apart manner, an inner ring of ports 212 comprising a second plurality of ports arranged in a circumferentially spaced apart manner, and a central port 213 positioned in a center of the chuck 200. Different arrangements for the ports 210 may be possible in alternative embodiments, including adjusting the spacing of the ports 210, the number of ports, and the specific positioning of the ports 210.

As shown in FIG. 3, the backside dispenser 500 is fluidly coupled to the gas/nitrogen gas source 460 and to the clean dry air source 461. The backside dispenser 500 is also fluidly coupled to each of the plurality of ports 210 in the chuck 200. As a result, the backside dispenser 500 is configured to dispense the gas (either an inert gas such as nitrogen, clean dry air, or a mixture of the two) into and through the ports 210. The benefit of this injection of the gas into the bottom of the chuck 200 is that it helps to prevent aerosols, droplets, and/or particles from passing into the space between the substrate and the floor 202 of the chuck 200 during a coating operation. Specifically, as discussed previously, as the substrate rotates with the coating material thereon, the coating material spreads evenly across the substrate and flies off the edges of the substrate. As the coating material flies off the edges of the substrate, it hits the wall of the process bowl 100 and creates aerosols, droplets, and/or particles, which may travel back towards the substrate. By blowing gas in through the bottom of the chuck 200, the gas will prevent those aerosols/particles from entering into the gaps between the substrate and the floor 202 of the chuck 200, which will prevent contamination of the surface of the substrate that is opposite the surface being coated. That is, the gas will blow the aerosols, droplets, and or particles in a direction away from the chuck 200 and substrate to prevent redepositing and contamination.

The chuck 200 comprises an air deflector 230 that is in the form of a disc that is positioned centrally along the chuck 200 and spaced above the floor 202 of the chuck 200. The air deflector 230 may comprise holes 231 extending therethrough to allow the passage of air through the air deflector 230. Moreover, the air deflector 230 is positioned so that air being introduced through any of the central ports 210 of the chuck 200 will be deflected outwardly away from the rotational axis B-B of the chuck 200 and towards the edges of the chuck 200 and substrate. This serves the same purposes as noted above with regard to preventing redeposit of aerosols/droplets onto the major surfaces of the substrate during the coating operation.

The chuck 200 comprises a plurality of support members 220 protruding upwardly from the annular top edge 203 of the chuck 200. In the exemplified embodiment, there are four of the support members 220 positioned in a circumferentially spaced apart manner along the annular top edge 203 of the chuck 200. However, there could be three or more than four of the support members 200 in other embodiments. The support members 220 are configured to support the substrate, and the relationship between the support members 220 and the substrate will be described in greater detail below with reference to FIGS. 10A and 10B.

The support members 220 are block-like protrusions extending from the annular top edge 203 of the chuck 200 which comprises a ledge portion 221 and an upstanding wall 222 extending from the ledge portion 221 to a distal end 223 of the support member 220. The upstanding wall 222 comprises an inner surface 224 and an outer surface 225 opposite the inner surface 224. The ledge portion 221 is oriented so as to be angled downwardly with distance from the inner surface 224 of the upstanding wall 222 towards a rotational axis B-B of the chuck 200. Moreover, the inner surface 224 may be oriented at a slight angle relative to the rotational axis B-B of the chuck. That is, the inner surface 224 may be angled outwardly in a direction away from the rotational axis B-B as it extends from the ledge 221 to the distal end 223. This slight angle in the inner surface 224 along with the downward angle of the ledge portion 221 ensures that the lower surface of the substrate (the surface that is not being coated) will not be in direct contact with any part of the chuck 200 or the support members 220 thereof. Rather, only the peripheral edge of the substrate (the edge between the first and second surfaces), and more specifically the lowermost edge of the peripheral edge of the substrate, may be contacted by the chuck 200, as discussed further below.

The inner surface 224 of the upstanding wall 222 is concave. The outer surface 225 of the upstanding wall 222 is convex. Furthermore, a thickness of the upstanding wall 222 measured at the distal end 223 decreases moving in a clockwise direction. Due to the shape of the upstanding wall 222, the support members 220 have a positive angle of attack. That is, the upstanding walls 222 are in the shape of wings having a positive angle of attack during spinning of the chuck 200 about the rotational axis B-B. As a result, during rotation of the chuck 200 about the rotational axis B-B, the support members 200 generate an outward air flow so that the air moves outwardly away from the outer surface of the chuck 200 (i.e., away from the rotational axis B-B and therefore away from the substrate supported on the chuck 200). This additional outward air flow, in addition to any gas flowing through the ports 210 described above, prevents aerosols, droplets, particles, and the like from becoming redeposited on the substrate, as has been described throughout this document. The shape of the upstanding walls 222 reduces or eliminates turbulent airflow around the area of contact between the chuck 200 and the substrate 50, which helps to reduce or eliminate aerosols, droplets, or particles from becoming redeposited onto the substrate during the spin coating operation.

Figure 10A:
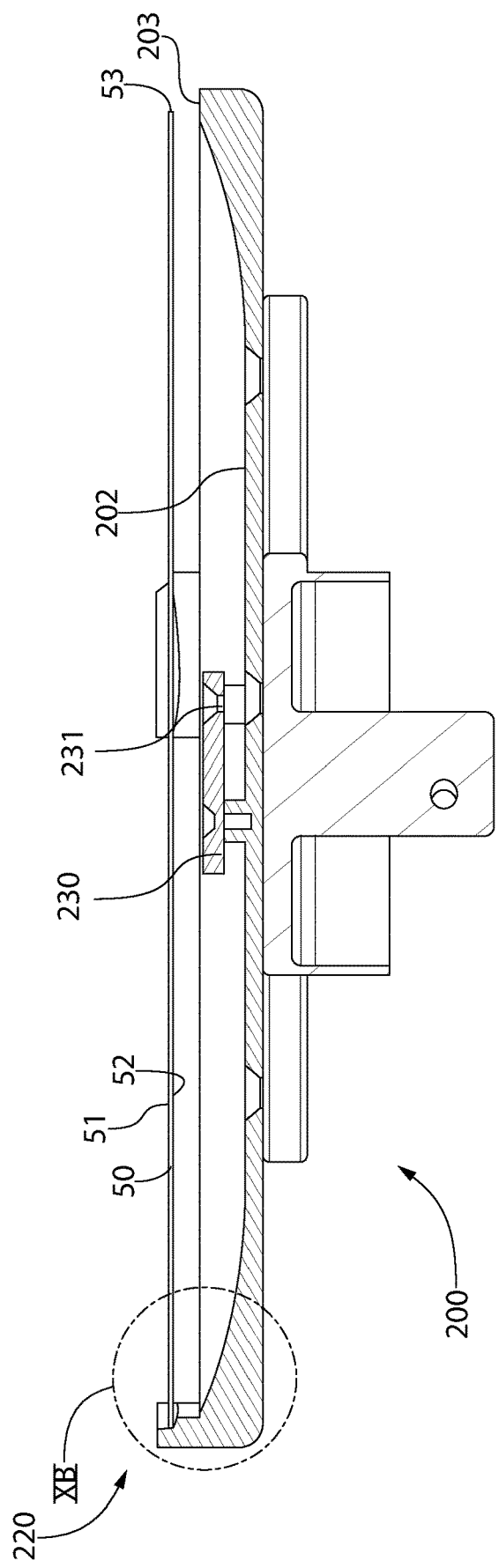
FIG. 10A is a front plan view of the chuck holding a substrate.
Figure 10B:
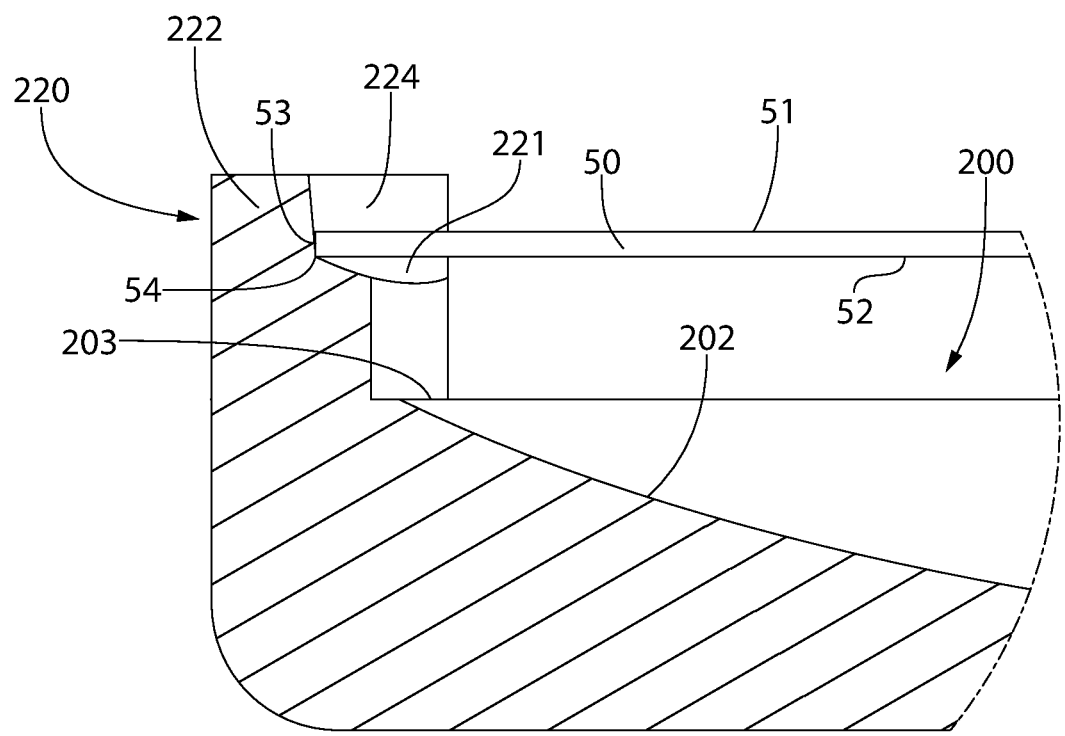
FIG. 10B is a close-up perspective view of area XB of FIG. 10A.
Figure 11A:
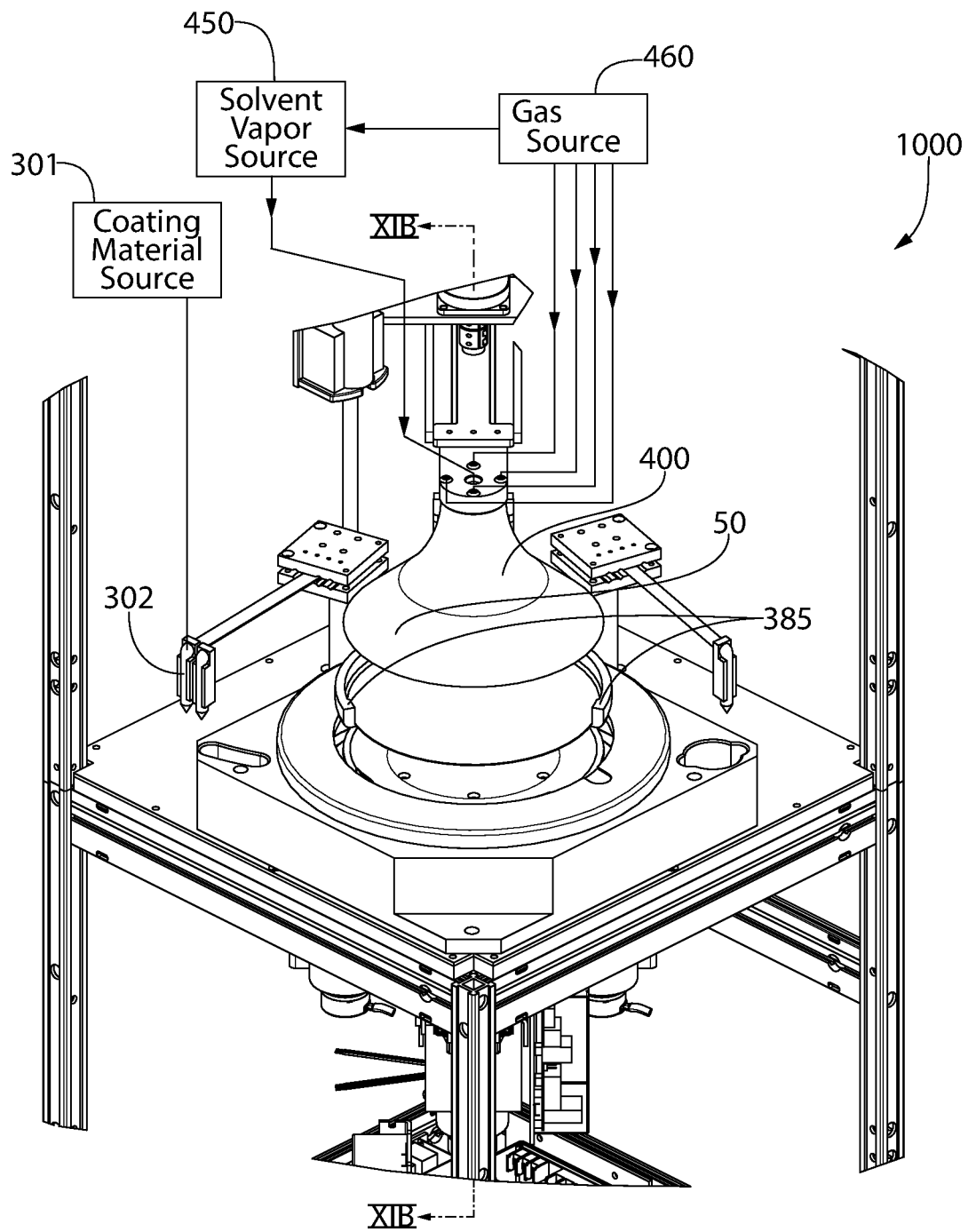
FIG. 11A is a partial top perspective view of the substrate coating system of FIG. 1 with the shield member in an up position, the substrate being supported by support arms, and various fluid sources and connections illustrated schematically.
Figure 11B:
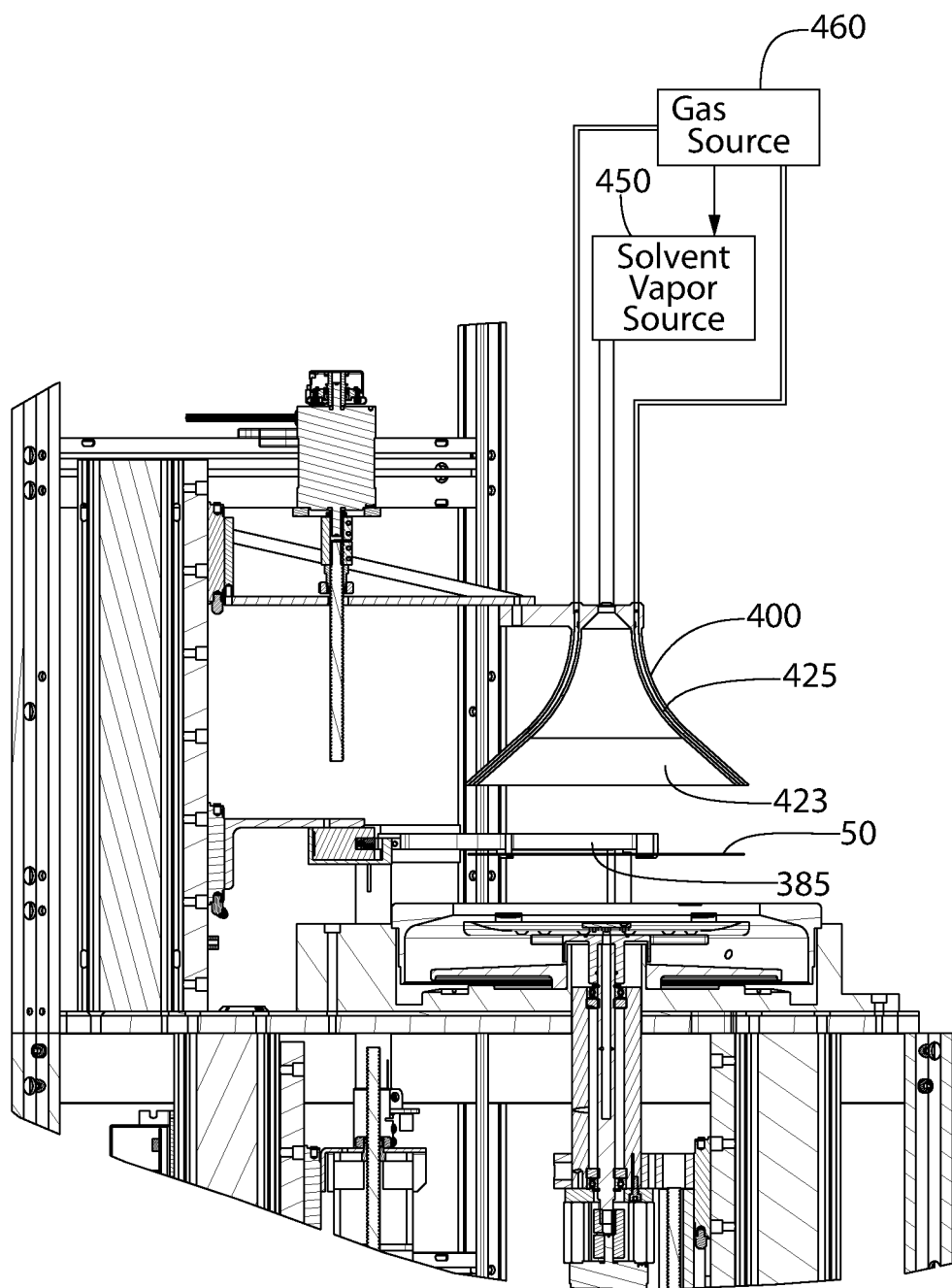
FIG. 11B is a cross-sectional view taken along line XIB-XIB of FIG. 11A.

FIG. 10A illustrates the chuck 200 supporting the substrate 50, and FIG. 10B is a close-up showing the interaction between the support member 220 of the chuck 200 and the substate 50. The substrate 50 comprises a first surface 51 (which may be the backside of the substrate 50 in some embodiments, although this is not required) and a second surface 52 (which may be the front side of the substrate 50 in some embodiments) opposite the first surface 51. The first surface 51 is the surface being coated by the coating material and the second surface is the surface that is not being coated during the current operation. The substrate 50 also comprises a peripheral edge 53 that extends between the first and second surfaces 51, 52. Furthermore, the substrate 50 has a lowermost edge 54, which is the edge formed at the intersection between the peripheral edge 53 and the second surface 52. The substrate 50 is specifically positioned so that the lowermost edge 54 of the substrate 50 (i.e., the edge where the peripheral edge 53 meets the second surface 52) is in contact with the inner surface 224 of the upstanding wall 222. It is possible that some part of the peripheral edge 53 is also in contact with the inner surface 224 of the upstanding wall 222. However, since the inner surface 224 of the upstanding all 222 is angled outwardly away from the rotational axis B-B with increasing distance from the ledge portion 221, it is likely that only the lowermost edge 54 of the substrate 50 contacts the inner surface 224 of the upstanding wall 222. The contact between the inner surface 224 of the upstanding wall 222 and the substrate 50 ensures that as the chuck 200 rotates, so too does the substrate 50 which is supported and held by the chuck 200. The substrate 50 is held by the chuck 200 at an elevated position relative to the ledge 221 so that the second surface 52 of the substrate 50 is not in contact with the ledge 221, leaving the second surface 52 of the substrate 50 completely free of contact with any part of the chuck 200. Furthermore, the support members 220 may be arranged so that the center of rotation of the substrate 50 is offset from the rotational axis B-B (i.e., the center of rotation) of the chuck 200. This offset may be between approximately 0.5 mm and 1.0 mm in some embodiments. Due to this offset, the peripheral edge 53 of the substrate 50 is in contact with at least two of the support members 220 at all times during rotation of the substrate 50.

Referring sequentially to FIGS. 11A-14B, a spin coating operation using the system 1000 detailed above will be described. First, referring to FIGS. 11A and 11B, the system 1000 is illustrated with the substrate 50 being held by the gripper arms 385. The gas source (or nitrogen source) 460 is fluidly coupled to the solvent vapor source 450 to generate the solvent vapor, which is in turn fluidly coupled to the central chamber 423 of the shield member 400 as described above. As discussed above, the solvent vapor is formed by flowing the gas/nitrogen through a bubbler tank, and this bubbler tank is what is being referred to herein as the solvent vapor source 450. The gas/nitrogen gas source 460 is also fluidly coupled directly to the peripheral passageway 425 of the shield member 400 to introduce the gas (e.g., nitrogen gas) into the peripheral passageway 425. The source of the coating material 301 is fluidly coupled to the dispensing arm 302 so that the coating material can be dispensed onto the substrate 50 at the appropriate time during the process. At this point in the process, the gas and solvent vapor may not yet be flowing into the shield member 400. However, it is possible that the solvent vapor could begin flowing at this stage in order to begin generating a solvent rich ambient around the substrate 50. The exact timing sequence for initiating the solvent vapor flow through the central chamber 423 and the gas flow through the peripheral passageway 425 may be modifiable and determined by the end user in some embodiments.

The next step in the process is to transfer the substrate 50 from the pair of gripper arms 385 to the chuck 200. This is achieved in several steps. First, the second actuator unit 290 is activated to move the chuck 200 from its down position (see FIGS. 11A and 11B) to its up position (see FIGS. 12A and 12B). As discussed previously, this may be achieved automatically by the controller 900 or via manual action by the user due to activation of the second actuator unit 290 that controls the upward/downward movement of the chuck 200. Once the chuck 200 is in the up position, the pair of gripper arms 385 are transitioned from their inward position (see FIGS. 11A and 11B) to their outward position (see FIGS. 12A and 12B). That is, one or both of the gripper arms 385 are made to pivot outwardly away from one another, to disengage the gripper arms 385 from the substrate 50. Once the gripper arms 385 become disengaged from the substrate 50, the substrate 50 becomes fully supported by the support members 220 of the chuck 200.

Figure 13A:
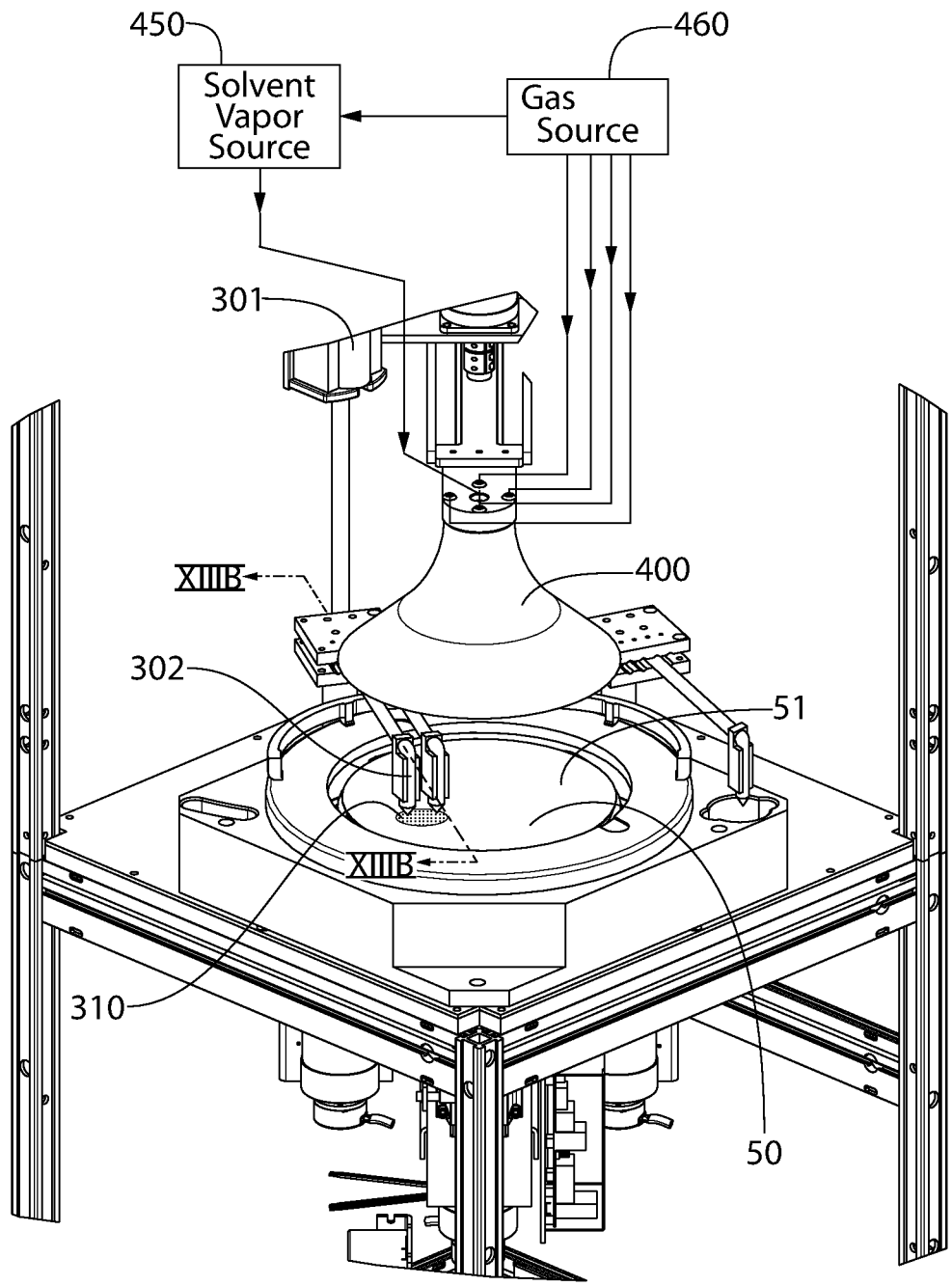
FIG. 13A is a partial top perspective view of the substrate coating system of FIG. 1 with the chuck in a down position and supporting the substrate and with dispensers of a dispensing subsystem positioned over the substrate and dispensing a coating material thereon.
Figure 13B:
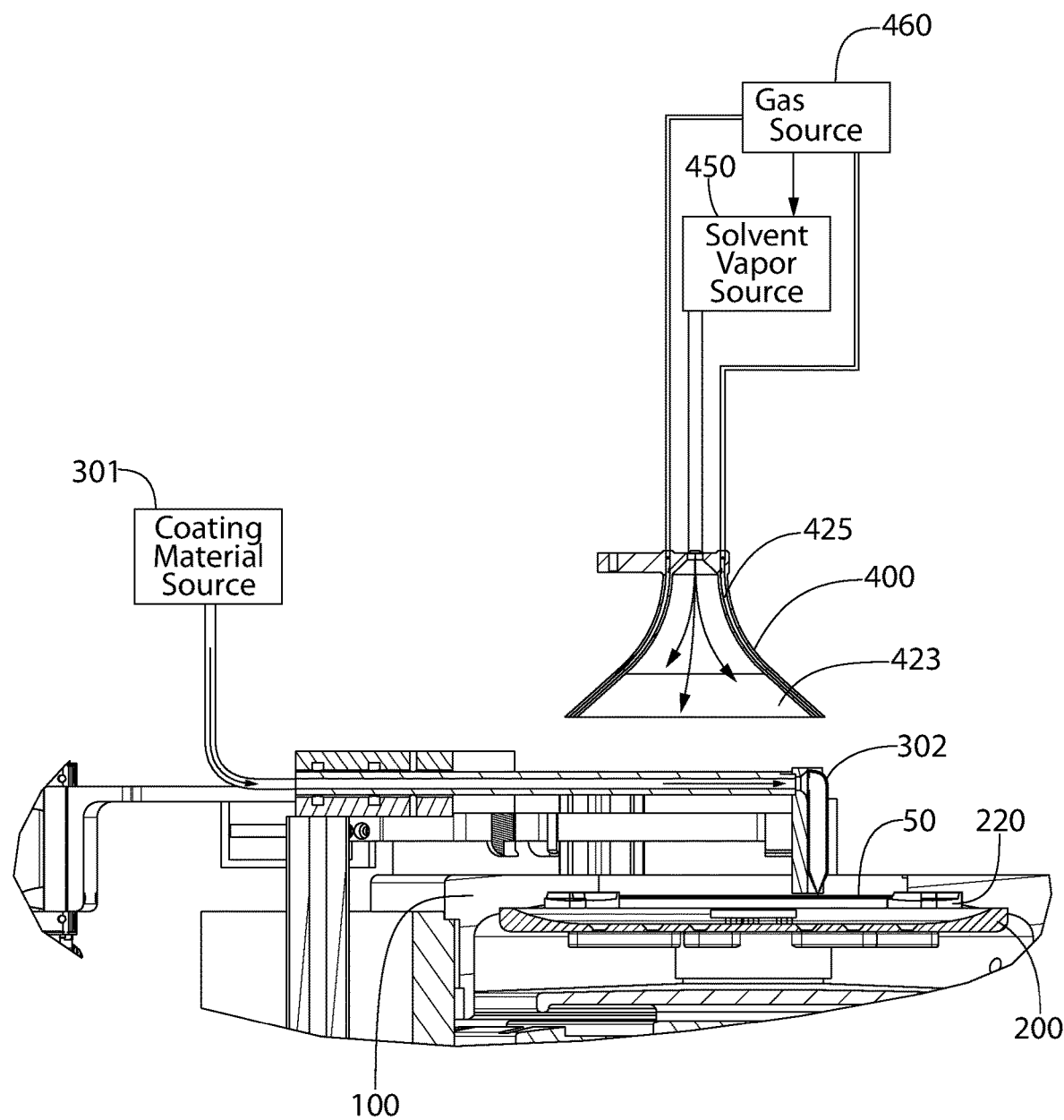
FIG. 13B is a cross-sectional view taken along line XIIIB-XIIIB of FIG. 13A, with a coating material source and its fluid coupling to the dispensers illustrated schematically.

In some embodiments, various of the valves shown in FIG. 3 may be opened once the substrate 50 is supported by the chuck 200 to begin flowing the solvent vapor from the solvent vapor source 450 into the central chamber 423 of the shield member 400 and to begin flowing the gas from the gas source 460 into the peripheral chamber 425 of the shield member 400. Thus, arrows are provided in FIG. 12B to illustrate the flow of the solvent vapor and the gas into the shield member 400. However, in other embodiments, the gas and solvent vapor may not flow (i.e., the relevant valves may not be open) until after the chuck 200 has been returned to its down position, which is shown in FIGS. 13A and 13B and described below. Moreover, in some embodiments the solvent vapor may flow into the central chamber 423 at this stage, but the gas may not yet flow into the peripheral chamber 425. These minor processing variations may exist and may be dependent on user selection and preference in some embodiments.

Next, referring to FIGS. 13A and 13B, the chuck 200 has been moved from the up position to the down position and the dispensing arm 302 has been moved so that it overlies and is aligned with the substrate 50 so that the coating material dispensed therefrom will be dispensed onto the substrate 50. The chuck 200 may be moved due to activation of the second actuator unit 290, which may be controlled by the controller 900 as discussed above or manually. As noted above, the dispensing arm 302 may be moved into the dispensing position via activation of the third actuator unit 390, which may be controlled by the controller 900 or manually. Activation of the third actuator unit 390 causes the dispensing arm 302 to pivot or rotate from its non-dispensing position where it is not positioned over the substrate 50 to its dispensing position where it is positioned over top of the substrate 50 as shown in FIGS. 13A and 13B. Once the dispensing arm 302 has been altered into the dispensing position such that it, or its nozzle or dispensing end, overlies the substrate 50, the coating material may be made to flow from the coating material source 301 to the dispensing arm 302, whereby the coating material is dispensed onto the first surface 51 of the substrate 50. FIG. 13A illustrates some of the coating material 310 having been dispensed onto the substrate 50.

In some embodiments, the chuck 200 and therefore also the substrate 50 may be rotating while the coating material is being dispensed onto the substrate 50. In particular, the chuck 200 and the substrate 50 may rotate at a first rotational velocity while the coating material is being dispensed, and then the chuck 200 and the substrate 50 may rotate at a second rotational velocity that is greater than the first rotational velocity after the desired amount of the coating material has been dispensed onto the substrate 50. In other embodiments, the chuck 200 and the substrate 50 may not be made to rotate until after the desired amount of the coating material has been dispensed onto the substrate 50. As discussed previously, the chuck 200 may be rotated by the motor 299, shown and described with reference to FIG. 2, which may be controlled by the controller 900. During this step in the process, the solvent vapor may be flowing into the central chamber 423 of the shield member 400 and the nitrogen gas may be flowing into the peripheral chamber 423 of the shield member 400. However, this is not required in all embodiments and in other embodiments the solvent vapor may be flowing into the central chamber 423 as this point in the process but the nitrogen gas may not yet be flowing into the peripheral chamber 423. In still other embodiments, neither the solvent vapor nor the nitrogen gas may be flowing at this stage in the process. However, it is preferable in some embodiments to start flowing the solvent vapor into the central chamber 423 as this step in the coating process in order to begin creating the solvent rich ambient around the substrate 50 to prevent evaporation of solvent from the coating material or polymer.

Figure 14A:
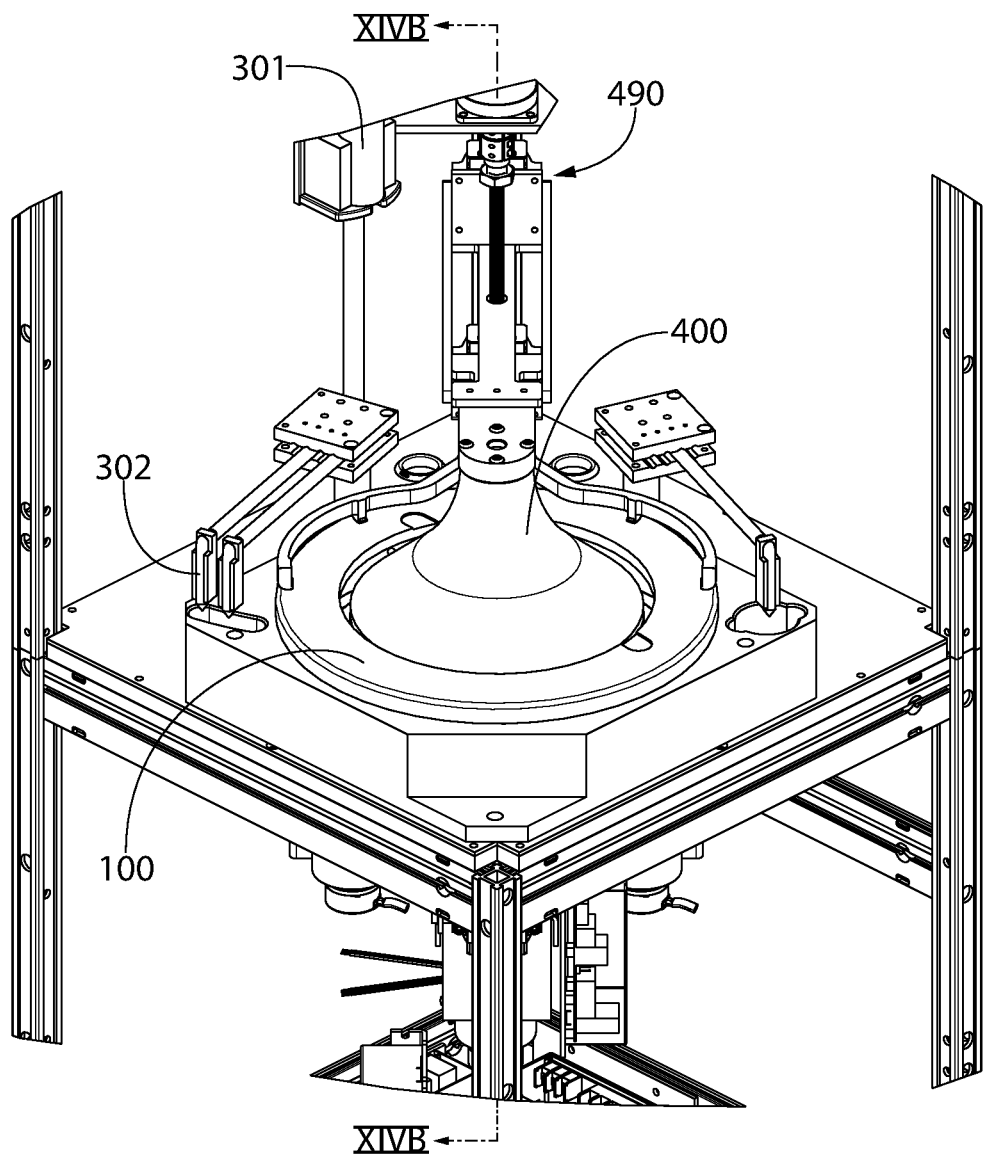
FIG. 14A is a partial top perspective view of the substrate coating system of FIG. 1 with the chuck supporting the substrate in a down position and with the shield member in a down position.
Figure 14B:
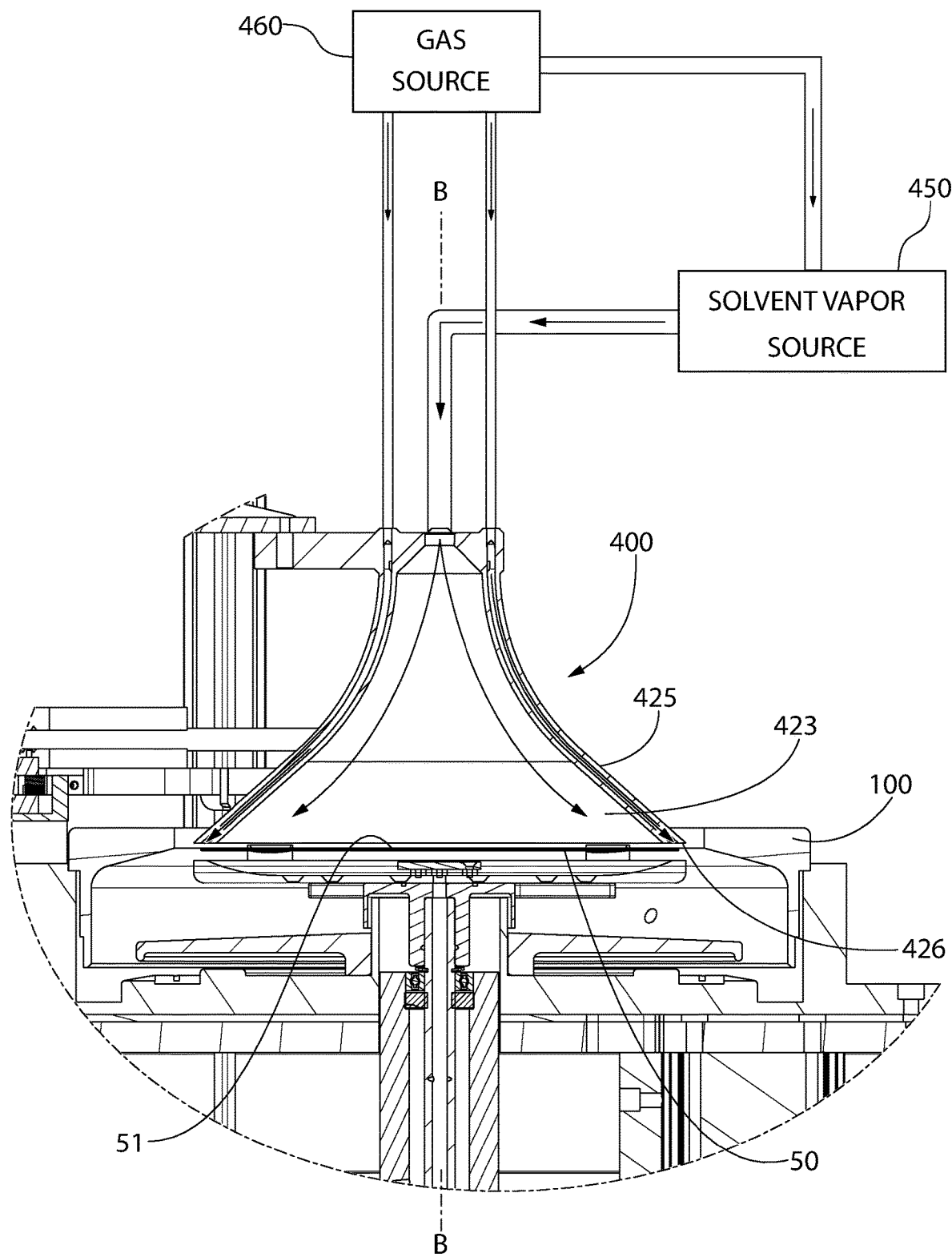
FIG. 14B is a cross-sectional view taken along line XIVB-XIVB of FIG. 14A, with the nitrogen and solvent vapor sources and their fluid coupling to the shield member illustrated schematically.

Next, referring to FIGS. 14A and 14B, the dispenser arm 302 is moved or otherwise altered into its non-dispensing position whereby the dispenser arm 302 is not aligned with the chuck 200 or the substrate 50. Again, the movement of the dispenser arm 302 may be achieved automatically via the third actuator unit 390 which is controlled by the controller 900. This moves the dispenser arm 302 out of the way so that the shield member 400 may be moved downwardly into close proximity to the substrate 50. Thus, after the dispenser arm 302 is moved into the non-dispensing position, the first actuator unit 490 may be activated to move the shield member 400 downwardly towards the substrate 50. The shield member 400 is preferably moved downwardly until it is positioned quite close to the first surface 51 of the substrate 50 which is being treated. In some embodiments, the bottom end 402 of the shield member 400 may be no more than 5 mm, or more specifically no more than 3 mm away from the first surface 51 of the substrate 50 when the shield member 400 is in its final down position. In other embodiments, the shield member 400 may be between 1 mm and 2 mm, or more specifically between 1 mm and 1.5 mm from the first surface 51 of the substrate 50. In other embodiments, the shield member 400 may be between 0.1 mm and 10 mm from the substrate 50 when in the down position, or more specifically between 0.1 mm and 7 mm, or more specifically between 0.1 mm and 5 mm, or still more specifically between 0.1 mm and 3 mm. When the shield member 400 is in the downward position, it should be closer than one-half inch from the substrate 50, and more specifically in some embodiments it should be closer than one-quarter inch from the substrate. By placing the shield member 400 so close to the substrate 50, little room is left for aerosols or other particles to enter into the space between the shield member 400 and the substrate 50, which could contaminate the substrate 50. Additional steps are taken, as described below, to prevent aerosols from entering into the space between the substrate 50 and the shield member 400.

When the shield member 400 is in the fully down position as shown in FIGS. 14A and 14B, the solvent vapor is flowing from the solvent vapor source 450 into the central chamber 423 of the shield member 400. Of course, as noted above, the solvent vapor may already have been flowing earlier in the process. The solvent vapor creates a solvent rich ambient around the substrate 50. This can be important because the coating material has a solvent which evaporates, which in turn cools the coating material and increases the viscosity of the coating material. Thus, without the solvent rich ambient, as the coating material spreads towards the edges of the spinning substrate, the thickness of the coating on the surface of the substrate increases, which can result in a coating that is thinner near the center and thicker near the edges. By engulfing the substrate in a solvent rich ambient, evaporation of the solvent in the coating material is decreased significantly or eliminated.

Furthermore, when the shield member 400 is in the fully down position as shown in FIGS. 14A and 14B, the gas (e.g., nitrogen) is flowing from the gas source 460 into the peripheral chamber 425 of the shield member 400, and out through the outlet 426. The gas exits the outlet 426 as a gas stream that flows towards the substrate 50 in an outward direction away from the rotational axis B-B of the chuck 200 and the substrate 50. The outlet 426 of the peripheral chamber 425 of the shield member 400 is located immediately adjacent to the outermost portion of the first surface 51 of the substrate 50. Thus, the gas stream flows towards the outermost portion of the first surface 51 of the substrate in a direction away from the rotational axis B-B and towards the peripheral edge portion of the substrate 50. This gas flow may be an annular flow of the gas in some preferred embodiments, and it significantly reduces the likelihood of any aerosols, droplets, or other particles passing into the very small space between the shield member 400 and the substrate 50. That is, any droplets or aerosols that are created due to the coating material flying off the substrate and contacting the inner surfaces of the process bowl 100 will be blown away from the substrate 50 by the gas stream and otherwise blocked from being redeposited onto the substrate 50 by the shield member 400.

With the shield member 400 in the fully down position, no portion of the shield member 400 extends below the first surface 51 of the substrate 50. That is, the horizontal plane P upon which the entirety of the bottom end 402 of the shield member 400 lies remains elevated above the first surface 51 of the substrate 50. This prevents the coating material that is being flung off the substrate 50 from becoming adhered to the inner surface 421 of the shield member 400, which could cause it to drip onto the substrate 50 and would be undesirable. Instead, any coating material that is removed from the substrate 50 during the spin coating process will pass through the gap between the bottom end 402 of the shield member 400 and the first surface 51 of the substrate 50 and potentially splash onto the inner wall of the process bowl 100. Thus, no portion of the substrate 50 is positioned within the central chamber 423 of the shield member 400 at any time during the coating operation.

After the first surface 51 of the substrate 50 is sufficiently coated, the motor 299 will be deactivated to stop the chuck 200 and the substrate 50 from spinning. The shield member 400 will be moved back into its upward position by activation of the first actuation unit 490. The chuck 200 will then be moved into its upward position by activation of the second actuation unit 290. The gripper arms 385 may then be altered into their inward position so that the gripper arms 385 are once again holding and supporting the substrate 50. Finally, a robot (not shown) may remove the substrate 50 from the gripper arms 385 and place the substrate 50 into a cassette box.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A method of coating a substrate, the method comprising:
supporting the substrate in a horizontal orientation;
positioning a shield member at a first distance from the substrate;
dispensing a coating material onto a first surface of the substrate;
moving the shield member towards the first surface of the substrate until the shield member is positioned a second distance from the substrate, the second distance being less than the first distance;
flowing a solvent vapor through a central chamber of the shield member to create a solvent rich ambient around the substrate;
rotating the substrate about a rotational axis to form a film of the coating material on the first surface of the substrate;
flowing a gas through a peripheral chamber of the shield member that at least partially surrounds the central chamber of the shield member, the gas exiting the peripheral chamber flowing towards the first surface of the substrate in a direction away from the rotational axis;
wherein the substrate is supported and rotated by a chuck, and further comprising flowing the gas through openings in a bottom surface of the chuck into a space between a second surface of the substrate and a floor of the chuck to prevent aerosols of the coating material from being deposited on the second surface of the substrate; and
wherein the first surface of the substrate is a back side of the substrate, wherein no vacuum is applied onto the substrate during the holding and rotating of the substrate, and wherein the rotational axis of the substrate is offset from a center of rotation of the chuck.

2. The method according to claim 1 wherein the peripheral chamber and the central chamber are fluidly isolated from one another by an inner wall of the shield member that defines an inner surface of the shield member.

3. The method according to claim 1 wherein the peripheral chamber is an annular passageway that circumferentially surrounds the central chamber and terminates in an annular opening in a bottom end of the shield member, and wherein the gas exiting the annular opening flows over the peripheral edge of the substrate in the direction away from the rotational axis to prevent aerosols of the coating material from redepositing onto the first surface of the substrate.

4. The method according to claim 1 wherein the chuck comprises a plurality of support members that are circumferentially spaced apart, each of the support members comprising a ledge portion and an upstanding wall portion extending from the ledge portion, wherein the support members are configured to move air outwardly away from the substrate as the chuck rotates.

5. The method according to claim 1 wherein the shield member comprises an inverted funnel shaped body that defines the central and peripheral chambers, wherein the central chamber has a cross-sectional area that increases moving from a top end of the central chamber to a bottom end of the shield member, and wherein the peripheral chamber has a constant cross-sectional area.

6. The method according to claim 1 wherein the back side of the substrate is opposite a device side of the substrate.

7. A method of coating a substrate, the method comprising:
supporting the substrate in a horizontal orientation by a chuck;
dispensing a coating material onto a first surface of the substrate, wherein the first surface of the substrate is a back side of the substrate;
positioning a shield member adjacent to the first surface of the substrate so that a bottom end of the shield member is adjacent to and spaced from the first surface of the substrate;
rotating the substrate about a rotational axis to form a film of the coating material on the first surface of the substrate, wherein no vacuum is applied onto the substrate during the rotation of the substrate, and wherein the rotational axis of the substrate is offset from a center of rotation of the chuck; and
flowing a gas through a peripheral chamber of the shield member, the gas exiting the peripheral chamber flowing towards the first surface of the substrate.

8. The method according to claim 7 wherein the gas flows through an outlet of the peripheral chamber of the shield member that is adjacent to a peripheral portion of the first surface of the substrate.

9. The method according to claim 7 wherein during the rotation of the substrate about the rotational axis, the shield member is spaced a distance between 0.1 mm and 10 mm from the first surface of the substrate.

10. The method according to claim 7 further comprising, prior to dispensing the coating material onto the first surface of the substrate, the shield member being spaced a first distance from the first surface of the substrate, and after dispensing the coating material onto the first surface of the substrate, moving the shield member towards the first surface of the substrate until the shield member is positioned a second distance from the first surface of the substrate, the second distance being less than the first distance.

11. The method according to claim 7 further comprising flowing a solvent vapor through a central chamber of the shield member to create a solvent rich ambient around the substrate, wherein the central chamber of the shield member is isolated from and surrounded by the peripheral chamber of the shield member.

12. The method according to claim 7 wherein the back side of the substrate is opposite a device side of the substrate.

13. The method according to claim 12 wherein the chuck supports the substrate without contacting any portion of the back side or the device side of the substrate.

14. The method according to claim 7 wherein the gas exiting the peripheral chamber forms a gas stream that flows towards the first surface of the substrate in a direction away from the rotational axis.

15. A method of coating a substrate, the method comprising:
loading the substrate onto a chuck that supports the substrate in a horizontal orientation;
dispensing a coating material onto a first surface of the substrate, the substrate further comprising a second surface opposite the first surface, the first surface of the substrate being a back side of the substrate and the second surface of the substrate being a front side of the substrate;
moving a shield member from a first position whereby the shield member is located a first distance from the substrate to a second position whereby the shield member is located a second distance from the substrate, the second distance being less than the first distance; and rotating the substrate about a rotational axis to form a film of the coating material on the first surface of the substrate, wherein the rotational axis of the substrate is offset from a center of rotation of the chuck;

wherein the substrate is supported by the chuck without any contact between the chuck and either of the back and front sides of the substrate.

16. The method according to claim 15 further comprising flowing a gas through a peripheral chamber of the shield member, the gas exiting the peripheral chamber flowing towards the first surface of the substrate.

17. The method according to claim 15 wherein no vacuum is applied onto the substrate during the rotation of the substrate about the rotational axis.

* * * * *